(12) United States Patent
Yang et al.

(10) Patent No.: US 12,507,537 B2
(45) Date of Patent: Dec. 23, 2025

(54) DISPLAY DEVICE

(71) Applicant: Samsung Display Co., Ltd., Yongin-si (KR)

(72) Inventors: Shinhyuk Yang, Yongin-si (KR); Donghan Kang, Yongin-si (KR); Jeehoon Kim, Yongin-si (KR); Junki Lee, Yongin-si (KR); Jongmoo Huh, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 179 days.

(21) Appl. No.: 17/500,446

(22) Filed: Oct. 13, 2021

(65) Prior Publication Data
US 2022/0130930 A1 Apr. 28, 2022

(30) Foreign Application Priority Data
Oct. 23, 2020 (KR) .................. 10-2020-0138586
Nov. 13, 2020 (KR) .................. 10-2020-0152281

(51) Int. Cl.
*H10K 59/124* (2023.01)
*H10D 30/67* (2025.01)
*H10K 59/131* (2023.01)

(52) U.S. Cl.
CPC ....... *H10K 59/124* (2023.02); *H10D 30/6713* (2025.01); *H10D 30/6755* (2025.01); *H10D 30/6757* (2025.01); *H10K 59/131* (2023.02)

(58) Field of Classification Search
CPC ............... H10K 59/124; H10K 59/131; H01L 29/78618; H01L 29/7869; H01L 29/78696
USPC ..................................................... 257/40
See application file for complete search history.

(56) References Cited

U.S. PATENT DOCUMENTS

| | | | |
|---|---|---|---|
| 7,253,035 B2 | 8/2007 | Kwak | |
| 7,468,527 B2 | 12/2008 | Ahn | |
| 9,000,523 B2* | 4/2015 | Choi | H10K 59/1213 257/E29.151 |
| 10,825,876 B2 | 11/2020 | Kim et al. | |
| 2005/0263768 A1 | 12/2005 | Ahn | |
| 2011/0141076 A1* | 6/2011 | Fukuhara | H01L 29/7869 257/E29.094 |
| 2013/0001564 A1 | 1/2013 | Choi et al. | |
| 2013/0302923 A1* | 11/2013 | Park | H10K 59/38 438/29 |

(Continued)

FOREIGN PATENT DOCUMENTS

| | | |
|---|---|---|
| JP | 2014-145857 | 8/2014 |
| KR | 10-1086478 | 11/2011 |

(Continued)

*Primary Examiner* — Ori Nadav
(74) *Attorney, Agent, or Firm* — HARNESS, DICKEY & PIERCE, P.L.C.

(57) ABSTRACT

A display device including a display area, a peripheral area adjacent to the display area, light-emitting diodes disposed in the display area, transistors electrically connected to the light-emitting diodes, and a pad section including a pad electrode having a multi-layered structure, the pad electrode being disposed in the peripheral area. The pad electrode includes a main metal layer, a first conductive layer on an upper surface of the main metal layer, the first conductive layer including a conductive oxide, and an auxiliary layer on a lower surface of the main metal layer.

15 Claims, 37 Drawing Sheets

(56) References Cited

U.S. PATENT DOCUMENTS

| | | | |
|---|---|---|---|
| 2014/0209914 A1 | 7/2014 | Nagasawa et al. | |
| 2015/0053966 A1* | 2/2015 | Steiger | C23C 18/1279 |
| | | | 257/43 |
| 2016/0268526 A1* | 9/2016 | Facchetti | H10K 10/481 |
| 2018/0053788 A1* | 2/2018 | Lee | H01L 21/32138 |
| 2018/0061895 A1 | 3/2018 | Kim et al. | |
| 2018/0097047 A1 | 4/2018 | Jung et al. | |
| 2019/0326360 A1* | 10/2019 | Gwon | H10K 50/865 |

FOREIGN PATENT DOCUMENTS

| | | |
|---|---|---|
| KR | 10-1160823 | 6/2012 |
| KR | 10-1815256 | 1/2018 |
| KR | 10-2018-0019793 | 2/2018 |
| KR | 10-2018-0025382 A | 3/2018 |
| KR | 10-2018-0036434 A | 4/2018 |
| KR | 10-2070148 | 1/2020 |
| KR | 10-2020-0034908 | 4/2020 |
| KR | 10-2020-0049223 A | 5/2020 |

* cited by examiner

DISPLAY DEVICE

CROSS-REFERENCE TO RELATED APPLICATION(S)

This application claims priority to and benefits of Korean Patent Application No. 10-2020-0138586, filed on Oct. 23, 2020 in the Korean Intellectual Property Office, and Korean Patent Application No. 10-2020-0152281, filed on Nov. 13, 2020 in the Korean Intellectual Property Office, the entire contents of which are incorporated herein by reference.

BACKGROUND

1. Technical Field

One or more embodiments relate to a display device.

2. Description of the Related Art

Display devices receive information regarding an image and display an image. Pad electrodes electrically connected to display elements are arranged on the edge of display devices to receive information for an image or the like. The pad electrodes may be electrically connected to pad electrodes of a printed circuit board or bumps of an integrated circuit.

SUMMARY

One or more embodiments include a display device including high-quality pad electrodes that do not deteriorate electric characteristics and that involve a reduced number of processes. However, such a technical approach is an example, and the disclosure is not limited thereto.

Additional aspects will be set forth in part in the description which follows and, in part, will be apparent from the description, or may be learned by practice of the embodiments of the disclosure.

According to one or more embodiments, a display device may include a display area, a peripheral area adjacent to the display area, light-emitting diodes disposed in the display area, transistors electrically connected to the light-emitting diodes, and a pad section including a pad electrode having a multi-layered structure, the pad electrode being disposed in the peripheral area, wherein the pad electrode may include a main metal layer, a first conductive layer on an upper surface of the main metal layer, the first conductive layer including a conductive oxide, and an auxiliary layer on a lower surface of the main metal layer.

The first conductive layer may include a transparent conductive oxide that is amorphous or crystalline.

The first conductive layer may include zinc indium tin oxide (ZITO).

The zinc indium tin oxide (ZITO) may be amorphous, and a tin content of the zinc tin oxide may be about 5 at % to about 25 at % with respect to a content of zinc and indium.

The first conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The display device may further include a second conductive layer disposed between the main metal layer and the first conductive layer, the second conductive layer including a metal different from a metal of the main metal layer.

The second conductive layer may include at least one of titanium, molybdenum, and tungsten.

The display device may further include at least one of a first oxide metal layer and a second oxide metal layer, wherein the first oxide metal layer is disposed between the main metal layer and the second conductive layer and includes a metal element same as a metal element of the main metal layer, and the second oxide metal layer is disposed between the second conductive layer and the first conductive layer and includes a metal element same as a metal element of the second conductive layer.

The auxiliary layer may include a metal layer or a transparent conductive oxide layer.

The display device may further include a wiring in the peripheral area, a first insulating layer disposed between the wiring and the pad electrode, the first insulating layer including a contact hole for electrical connection between the wiring and the pad electrode, and a second insulating layer overlapping a connection region of the wiring and the pad electrode, the second insulating layer including a hole overlapping the pad electrode.

The pad electrode may include an outer portion overlapping the second insulating layer, and an inner portion overlapping the hole of the second insulating layer, and a thickness of the outer portion may be greater than a thickness of the inner portion.

The second insulating layer may include an inorganic insulating material.

Each of the thin-film transistors may include a semiconductor layer including a channel region, a source region, and a drain region, the source region and the drain region being respectively disposed on two opposite sides of the channel region, a lower electrode disposed below the semiconductor layer, a gate electrode disposed over the semiconductor layer, the gate electrode overlapping the channel region, and an electrode electrically connected to the source region or the drain region, and the pad electrode may be disposed in a same layer as the lower electrode, the gate electrode, or the electrode.

According to one or more embodiments, a display device may include a display area, a peripheral area adjacent to the display area, light-emitting diodes disposed in the display area, transistors electrically connected to the light-emitting diodes, a wiring disposed in the peripheral area, and a pad electrode overlapping the wiring, the pad electrode electrically connected to the wiring. The wiring may include a main metal layer, and an auxiliary layer on a lower surface of the main metal layer. The pad electrode may include a first conductive layer disposed on an upper surface of the main metal layer and including a transparent conductive oxide, and a second conductive layer disposed between the main metal layer and the first conductive layer and including a material different from a material of the first conductive layer.

The display device may further include an insulating layer disposed between the main metal layer of the wiring and the second conductive layer of the pad electrode, wherein the insulating layer overlaps an edge of the main metal layer and includes a hole overlapping the main metal layer.

The first conductive layer of the pad electrode may include at least one of zinc indium tin oxide (ZITO), indium tin oxide (ITO), indium zinc oxide (IZO), zinc oxide (ZnO), indium oxide ($In_2O_3$), indium gallium oxide (IGO), and aluminum zinc oxide (AZO).

The main metal layer of the wiring may include copper, and the second conductive layer of the pad electrode may include a metal element different from a metal element of the main metal layer.

The second conductive layer may include at least one of titanium (Ti), molybdenum (Mo), and tungsten (W).

The display device may further include a first metal oxide layer disposed on the main metal layer of the wiring and including a metal element same as a metal element of the main metal layer.

The display device may further include a second metal oxide layer disposed between the second conductive layer and the first conductive layer and including a metal element same as a metal element of the second conductive layer.

The display device may further include a second insulating layer disposed on the first conductive layer of the pad electrode, the second insulating layer including a hole overlapping the first conductive layer.

The pad electrode may include an outer portion overlapping the second insulating layer, and an inner portion overlapping the hole of the second insulating layer, and a thickness of the outer portion may be greater than a thickness of the inner portion.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
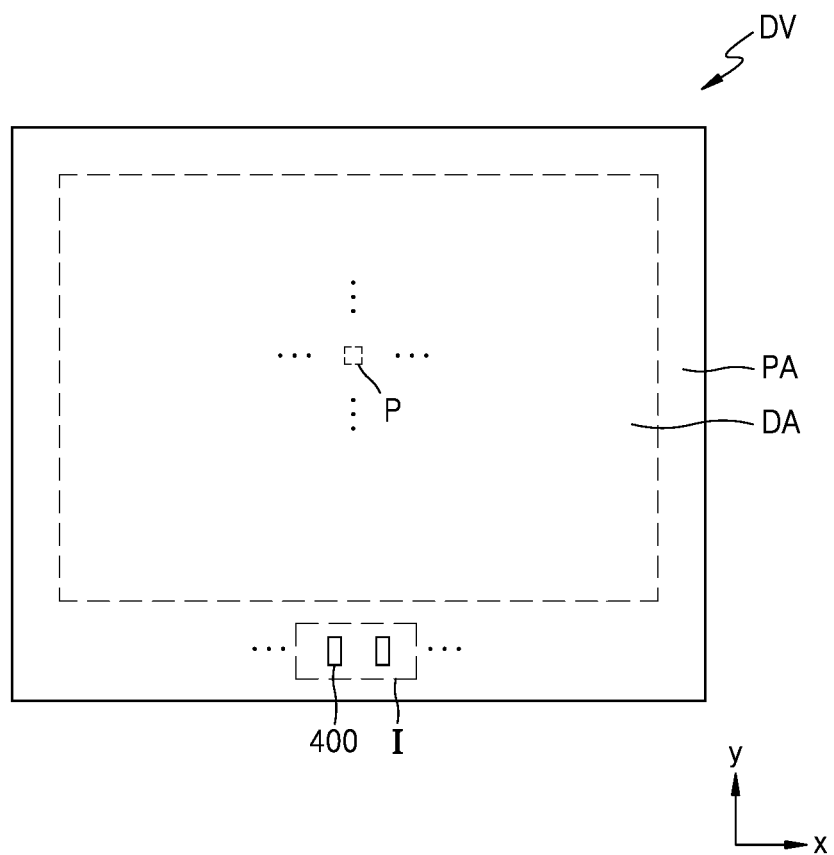
FIG. 1A is a schematic plan view of a display device according to an embodiment.

Reference will now be made in detail to embodiments, examples of which are illustrated in the accompanying drawings, wherein like reference numerals refer to like elements throughout. Repetitive descriptions may be omitted. The embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

While such terms as "first" and "second" may be used to describe various components, such components must not be limited to the above terms. The above terms are used to distinguish one component from another.

The singular forms "a," "an," and "the" as used herein are intended to include the plural forms as well (and vice versa) unless the context clearly indicates otherwise.

It will be understood that the terms "comprise," "comprising," "include," "including," "has," "have", and "having" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, intervening layers, regions, or components may be present.

Sizes of elements in the drawings may be exaggerated or reduced for convenience of explanation. For example, since sizes and thicknesses of elements in the drawings may be arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with another layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to the other layer, region, or component with another layer, region, or component interposed therebetween.

In the following examples, the x-axis, the y-axis and the z-axis may not be limited to three axes of the rectangular coordinate system, and may be interpreted in a broader sense. For example, the x-axis, the y-axis, and the z-axis may be perpendicular to one another, or may represent different directions that are not perpendicular to one another.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
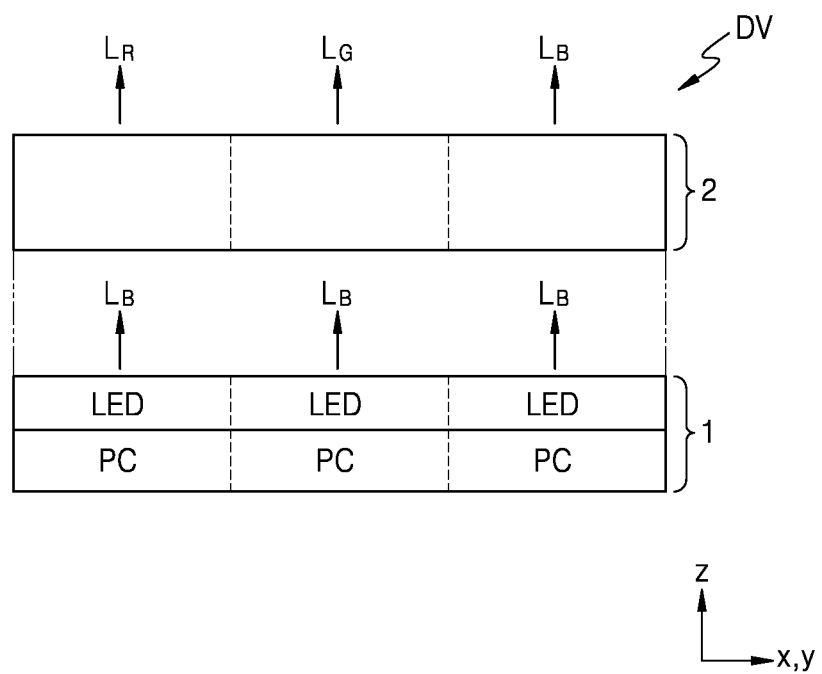
FIG. 1B is a schematic cross-sectional view of a display device according to an embodiment.

FIG. 1A is a schematic plan view of a display device DV according to an embodiment, and FIG. 1B is a schematic cross-sectional view of the display device DV according to an embodiment.

Referring to FIG. 1A, the display device DV may include a display area DA and a peripheral area PA outside the display area DA, pixels P being arranged in the display area DA. The peripheral area PA may be adjacent to (e.g., entirely surround) the display area DA.

As shown in FIG. 1B, the display device DV may include a light-emitting panel 1 and a filter panel 2 that may be stacked on each other. The light-emitting panel 1 may include light-emitting diodes LED, and each light-emitting diode LED may be electrically connected to a circuit (referred to as a pixel circuit PC, hereinafter). The light-emitting diodes LED and the pixel circuits PC may be arranged in the display area DA.

The display area DA may provide a preset image by using light of the light-emitting diodes LED. In an embodiment, blue light $L_B$ emitted from the light-emitting diodes LED may be converted to red light $L_R$ or green light $L_G$ while passing through the filter panel 2 or may pass through the filter panel 2 without conversion. The display device DV may display a preset image by using light converted or not converted by the filter panel 2, for example, red light $L_R$, green light $L_G$, and blue light $L_B$.

The peripheral area PA may be a non-display area in which the pixels may not be arranged. Pad electrodes 400 may be arranged in the peripheral area PA. Pad electrodes 400 may be apart from each other in the peripheral area PA. Each pad electrode 400 may be electrically connected to a printed circuit board or an integrated circuit element. The pad electrode 400 may be provided to the display panel 1.

Figure 2:
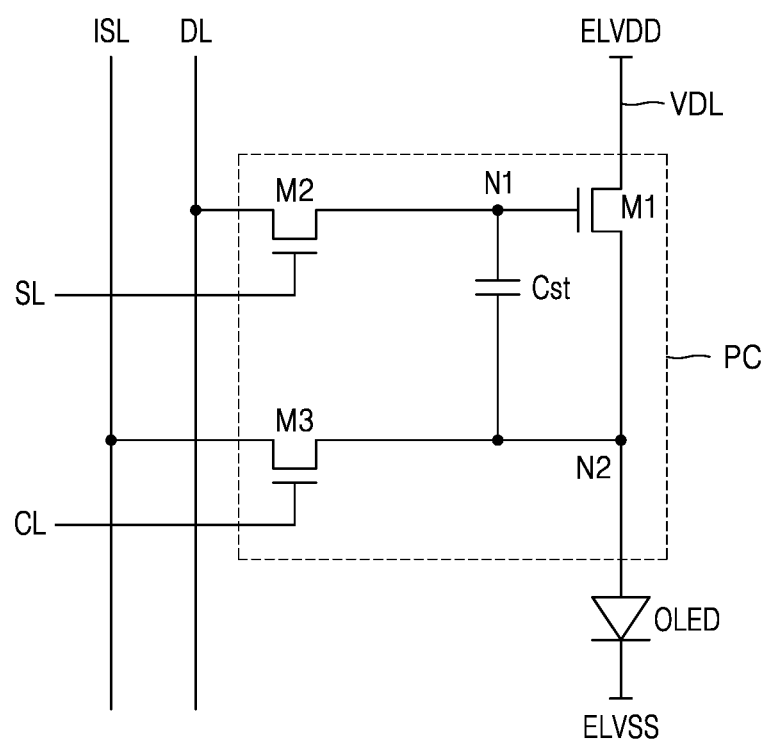
FIG. 2 is a schematic diagram of an equivalent circuit of a light-emitting diode and a pixel circuit connected to the light-emitting diode provided in a display panel, according to an embodiment.

FIG. 2 is a schematic diagram of an equivalent circuit of a light-emitting diode and a pixel circuit electrically connected to the light-emitting diode provided to the display panel 1 according to an embodiment.

Referring to FIG. 2, the light-emitting diode may include an organic light-emitting diode OLED, and the organic light-emitting diode OLED may be electrically connected to the pixel circuit PC including transistors and a capacitor.

The pixel circuit PC may include a first transistor M1, a second transistor M2, a third transistor M3, and a storage capacitor Cst.

Each of the first transistor M1, the second transistor M2, and the third transistor M3 may include an oxide semiconductor thin-film transistor including a semiconductor layer including an oxide semiconductor, or include a silicon semiconductor thin-film transistor including a semiconductor layer including polycrystalline silicon. A first electrode may be one of a source electrode and a drain electrode, and a second electrode may be the other of the source electrode and the drain electrode depending on the type of a transistor.

The first transistor M1 may be a driving transistor. A first electrode of the first transistor M1 may be electrically connected to a driving voltage line VDL configured to supply a driving power voltage ELVDD, and a second electrode of the first transistor M1 may be electrically connected to a pixel electrode of the organic light-emitting diode OLED. An opposite electrode of the organic light-emitting diode OLED may be electrically connected to a common voltage line configured to supply a common voltage ELVSS.

A gate electrode of the first transistor M1 may be connected to a first node N1. The first transistor M1 may be configured to control the amount of current flowing to the organic light-emitting diode OLED from the driving voltage line VDL according to the voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. In case that a scan signal is supplied to the scan line SL, the second transistor M2 may be turned on and may electrically connect the data line DL to the first node N1.

The third transistor M3 may be an initialization transistor and/or a sensing transistor. A first electrode of the third transistor M3 may be connected to a second node N2, and a second electrode of the third transistor M3 may be connected to an initialization-sensing line ISL. A gate electrode of the third transistor M3 may be connected to a control line CL.

In case that a control signal is supplied to the control line CL, the third transistor M3 may be turned on and may electrically connect the initialization-sensing line ISL to the second node N2. In an embodiment, the third transistor M3 may be turned on according to a signal transferred through the control line CL and may transfer an initialization voltage from the initialization-sensing line ISL to the pixel electrode of the organic light-emitting diode OLED, thereby initializing the pixel electrode of the organic light-emitting diode OLED. In an embodiment, in case that a control signal is supplied to the control line CL, the third transistor M3 may be turned on and may sense characteristic information of the organic light-emitting diode OLED. The third transistor M3 may have both the function of the initialization transistor and the function of the sensing transistor, or have one of the function of the initialization transistor and the function of the sensing transistor. In an embodiment, in the case where the third transistor M3 has the function of the initialization transistor, the initialization-sensing line ISL may be named as an initialization voltage line. In the case where the third transistor M3 has the function of the sensing transistor, the initialization-sensing line ISL may be named as a sensing line. The initialization operation and the sensing operation of the third transistor M3 may be performed individually or performed simultaneously. In other words, the third transistor M3 may be the initialization transistor and/or the sensing transistor.

The storage capacitor Cst may be connected between the first node N1 and the second node N2. As an example, a first electrode of the storage capacitor Cst may be connected to the gate electrode of the first transistor M1, and a second electrode of the storage capacitor Cst may be connected to the pixel electrode of the organic light-emitting diode OLED.

Though it is shown in FIG. 2 that the pixel circuit PC includes three transistors and one storage capacitor, the number of transistors and the number of storage capacitors may be variously changed depending on the design of the pixel circuit PC in another embodiment.

Though it is shown in FIG. 2 that the light-emitting diode includes the organic light-emitting diode OLED that may include an organic material, the embodiment is not limited thereto. In another embodiment, the light-emitting diode may include an inorganic light-emitting diode that may include an inorganic material. The inorganic light-emitting diode may include a PN-junction diode that may include inorganic semiconductor-based materials. In case that a forward voltage is applied to a PN-junction diode, holes and electrons may be injected, energy created due to recombination of holes and electrons may be converted to light energy, and light of a color may be emitted. The inorganic light-emitting diode may have a width of several micrometers to hundreds of micrometers. In an embodiment, the inorganic light-emitting diode may be denoted by a micro light-emitting diode.

Figure 3:
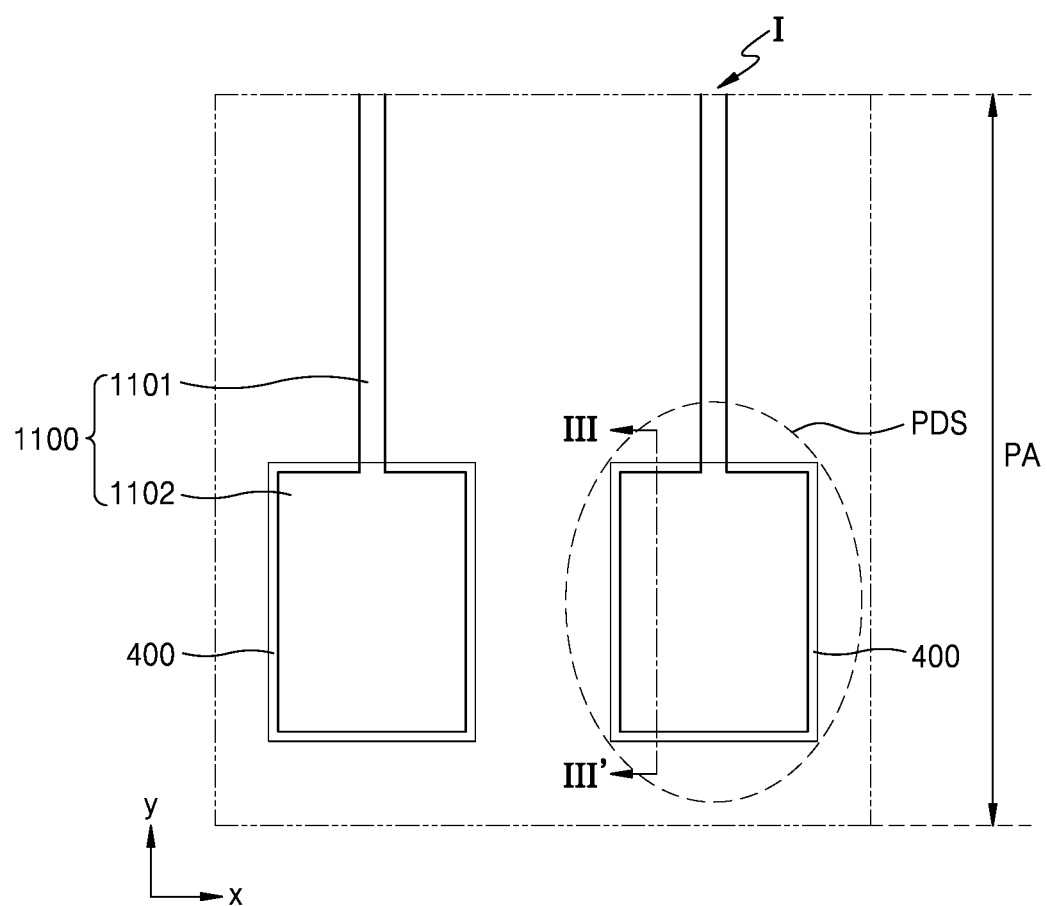
FIG. 3 is an enlarged schematic plan view of region I of FIG. 1A.

FIG. 3 is an enlarged schematic plan view of region I of FIG. 1A.

Referring to FIG. 3, a pad section PDS may include the pad electrode 400. The pad electrode 400 may be electrically connected to a wiring (or a lead-out wiring 1100). In an embodiment, the pad section PDS may include an overlapping structure in which the pad electrode 400 overlaps a portion (a second portion 1102 described below) of the wiring 1100.

Wirings 1100 may be arranged in the peripheral area PA. The wirings 1100 may be configured to electrically connect signal lines, for example, the data lines (or the scan lines) arranged in the display area DA to the pad electrodes 400. Each wiring 1100 may include a first portion 1101 (or a body portion) and a second portion 1102 (or a connection portion), the first portion 1101 extending in one direction to electrically connect the signal line to the pad electrode 400, and the second portion 1102 being arranged at the end of the first portion 1101.

The pad electrode 400 may overlap the wiring 1100. As an example, the pad electrode 400 may overlap the second portion 1102 of the wiring 1100. The pad electrode 400 may have a multi-layered structure including sub-layers, which are described with reference to FIGS. 4 to 9D.

Figure 4:
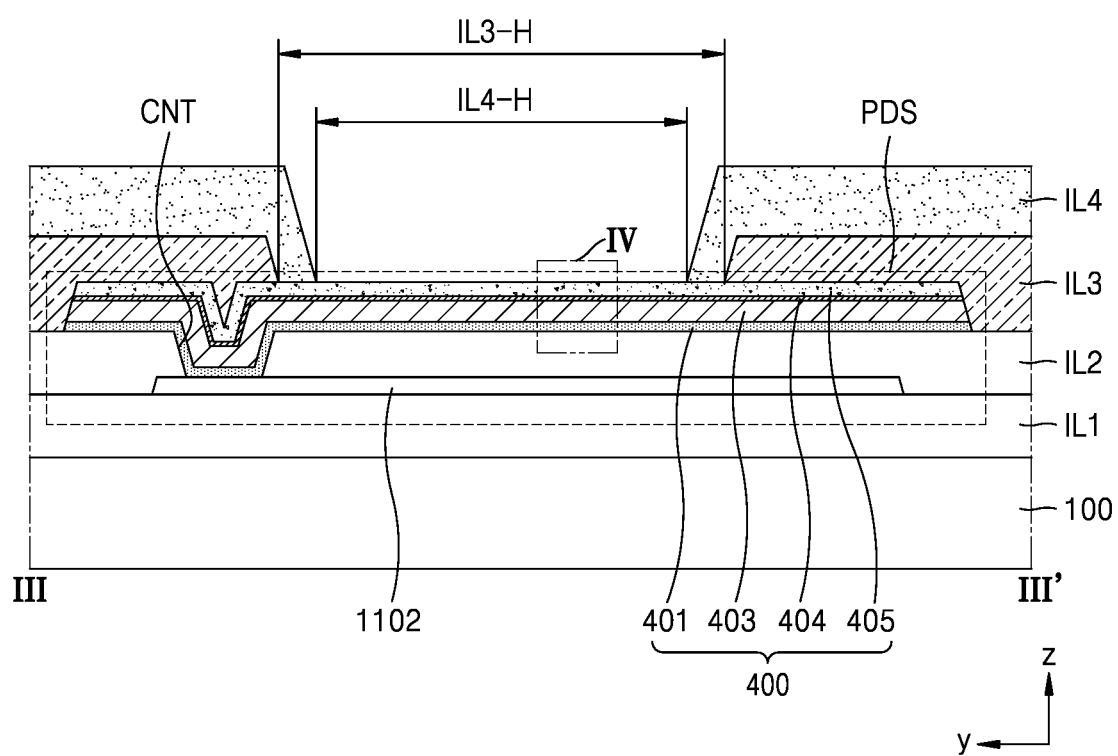
FIG. 4 is a schematic cross-sectional view of a pad electrode according to an embodiment, taken along line III-III' of FIG. 3.
Figure 5:
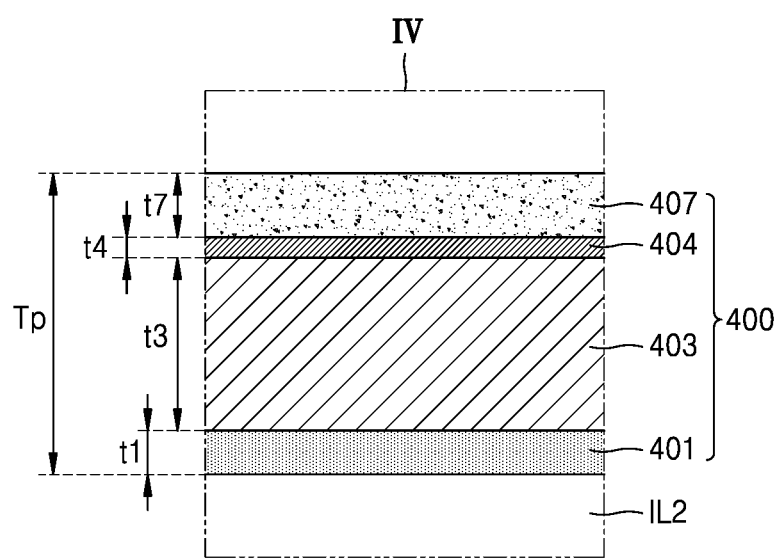
FIG. 5 is an enlarged schematic cross-sectional view of region IV of FIG. 4.

FIG. 4 is a schematic cross-sectional view of the pad electrode 400 according to an embodiment, taken along line III-III' of FIG. 3, and FIG. 5 is an enlarged schematic cross-sectional view of region IV of FIG. 4.

Referring to FIG. 4, the pad electrode 400 may be arranged over a substrate 100. Before the pad electrode 400 may be formed, at least one insulating layer may be arranged on the substrate 100.

The substrate 100 may include glass or a polymer resin. The substrate 100 including the polymer resin may be flexible. As an example, a display device including the substrate 100 having flexibility may be warped, curved, bendable, rollable, or foldable. Accordingly, the shape of the display device may be changed.

A first insulating layer IL1 and a second insulating layer IL2 may be arranged on the substrate 100. The pad electrode 400 may be arranged on the first insulating layer IL1 and the second insulating layer IL2.

The first insulating layer IL1 and the second insulating layer IL2 may include an inorganic insulating layer and/or an organic insulating layer. In an embodiment, the first insulating layer IL1 and the second insulating layer IL2 may include an inorganic insulating layer such as silicon oxide, silicon nitride, and/or silicon oxynitride. The first insulating layer IL1 and the second insulating layer IL2 may have a single-layered structure or a multi-layered structure including the above materials.

As shown in FIGS. 4 and 5, the pad electrode 400 may have a multi-layered structure including sub-layers. As an example, the pad electrode 400 may include a main metal layer 403, an auxiliary layer 401, a first conductive layer 407, and an oxide metal layer (referred to as the first oxide metal layer) 404, the auxiliary layer 401 being under the main metal layer 403, the first conductive layer 407 being over the main metal layer 403, and the first oxide metal layer 404 being between the main metal layer 403 and the first conductive layer 407.

The main metal layer 403 may be a sub-layer that occupies most of the pad electrode 400. In case that the main metal layer 403 occupies most of the pad electrode 400, it may mean that a thickness t3 of the main metal layer 403 may be 50% or more of an entire thickness Tp of the pad electrode 400. In an embodiment, the thickness t3 of the main metal layer 403 may be about 60% or more or about 70% or more of the entire thickness Tp of the pad electrode 400. In an embodiment, the thickness t3 of the main metal layer 403 may be about 10 times or more the thickness of other layers, for example, a thickness t1 of the auxiliary layer 401 and/or about 10 times or more the thickness of the first conductive layer 407. The main metal layer 403 may have a thickness of about 1000 Å to about 15000 Å. As an example, the main metal layer 403 may have a thickness of about 1000 Å to about 14000 Å, have a thickness of about 3000 Å to about 14000 Å, or have a thickness of about 3000 Å to about 11000 Å.

The main metal layer 403 may include copper (Cu), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca) and/or molybdenum (Mo) considering conductivity. The main metal layer 403 may have a single-layered structure and a multi-layered structure including the above materials. As an example, the main metal layer 403 may include copper (Cu). In an embodiment, the main metal layer 403 may include a single Cu layer.

The auxiliary layer 401 may be arranged on the lower surface of the main metal layer 403 and may improve adhesive force between the pad electrode 400 and a layer (e.g. the second insulating layer IL2) thereunder.

The auxiliary layer 401 may include a material different from that of the main metal layer 403. The auxiliary layer 401 may be a metal auxiliary layer including metal such as Ti considering conductivity and adhesive force. In another embodiment, the auxiliary layer 401 may include a transparent conductive oxide such as indium zinc oxide (IZO), gallium zinc oxide (GZO), and/or zinc indium oxide (ZIO). The transparent conductive oxide may be amorphous or crystalline.

The thickness t1 of the auxiliary layer 401 may be less than the thickness t3 of the main metal layer 403. As an example, the thickness t1 of the auxiliary layer 401 may be in the range of about 10 Å to about 1000 Å. In an embodiment, the thickness t1 of the auxiliary layer 401 may be about 50 Å to about 500 Å, be about 50 Å to about 400 Å, or be about 100 Å to about 300 Å.

The auxiliary layer 401 and the main metal layer 403 may be successively formed. Accordingly, the upper surface of the auxiliary layer 401 may directly contact the lower surface of the main metal layer 403. In an embodiment, the auxiliary layer 401 may include titanium and the main metal layer 403 may include copper. In the case where the auxiliary layer 401 and the main metal layer 403 include different materials, an interface between the auxiliary layer 401 and the main metal layer 403 may be viewed through the cross-sectional image of the pad electrode 400.

The first conductive layer 407 may be arranged over the upper surface of the main metal layer 403. The first conductive layer 407 may prevent the main metal layer 403 from being damaged during an etching process included in the process of manufacturing the display device. As an example, to prevent the main metal layer 403 from being damaged by etchant used during the process of etching the pixel electrode of the light-emitting diode of the display device, the first conductive layer 407 may be arranged over the main metal layer 403.

The first conductive layer 407 may include a conductive material, for example, amorphous or crystalline transparent conductive oxide (TCO) that may protect the main metal layer 403.

In an embodiment, the first conductive layer 407 may include indium tin oxide (ITO), indium zinc oxide (IZO), zinc oxide (ZnO), indium oxide ($In_2O_3$), indium gallium oxide (IGO), and/or aluminum zinc oxide (AZO). As an example, the first conductive layer 407 may include crystalline indium tin oxide, for example, a single layer of p-ITO in which Sn content may be about 5 at % to about 15 at %.

In another embodiment, the first conductive layer 407 may include zinc indium tin oxide (ZITO). Zinc indium tin oxide (ZITO) may be amorphous transparent conductive oxide, may be mostly amorphous and may include a partially crystallized region.

The first conductive layer 407 may be formed through a sputtering process. The first conductive layer 407 formed through the sputtering process may include a small amount of pinholes. A possibility that the main metal layer 403 may be damaged by the pinholes during the above process may not be high. However, in the case where a heat treatment process may be performed among the process of manufacturing the display device, the first conductive layer 407 may be crystallized and may include the pinholes during the heat treatment process depending on a material of the first conductive layer 407. The pinholes due to the crystallization may provide paths through which etchants used for the process of etching the pixel electrode of the light-emitting diode included in the display device may pass.

In the case where the first conductive layer 407 includes amorphous transparent conductive oxide, for example, zinc indium tin oxide (ZITO), a possibility that etchants progressing through the pinholes due to the heat treatment process damage the main metal layer 403 may be advantageously reduced. Because zinc indium tin oxide (ZITO) may maintain an amorphous state (e.g., a partially crystallized amorphous state) even after the heat treatment may be performed, the damage to the main metal layer 403 by the etchants may be reduced.

As an example, the first conductive layer 407 may be zinc indium tin oxide (ZITO) in which Sn content compared to Zn and In contents may be about 5 at % to about 25 at % (more specifically, Sn contents may be about 7 at % to about 15 at %). As an example, in the case where Sn content satisfies the above range, an appropriate etch rate may be secured with respect to etchant of an etching process of forming the pad electrode 400 and/or etchant of an etching process of forming the pixel electrode, chemical resistance may be secured, and the length of a tip that may be formed on the pad electrode 400 may be easily controlled. In an embodiment, relative content of zinc (Zn) and indium (In) among zinc indium tin oxide (ZITO) may be substantially the same or indium (In) may be more included than tin (Sn).

The first oxide metal layer 404 may be arranged between the main metal layer 403 and the first conductive layer 407. As an example, the lower surface of the first oxide metal layer 404 may directly contact the upper surface of the main metal layer 403. The upper surface of the first oxide metal layer 404 may directly contact the lower surface of the first conductive layer 407, and an interface between the first oxide metal layer 404 and the first conductive layer 407 may be viewed in the cross-sectional image.

The first oxide metal layer 404 may include a metal element different from a metal element contained in the first conductive layer 407. The first oxide metal layer 404 may be a metal oxide including a first metal. The first metal may be a metal element included in the main metal layer 403. As an example, in the case where the main metal layer 403 includes copper, the first oxide metal layer 404 may include copper oxide ($CuO_x$). A thickness t4 of the first oxide metal layer 404 may be about 5 Å to about 200 Å. In an embodiment, the thickness t4 of the first oxide metal layer

404 may be about 10 Å to about 200 Å, about 5 Å to about 100 Å, or about 5 Å to about 30 Å.

Because the main metal layer 403 and the first oxide metal layer 404 may include the same metal element (e.g., the first metal), an interface between the main metal layer 403 and the first oxide metal layer 404 may be determined based on oxygen content. As an example, in case that a component is analyzed in a direction (a z-direction) from the main metal layer 403 to the first oxide metal layer 404, a section in which oxygen content increases may correspond to the first oxide metal layer 404.

A thickness t7 of the first conductive layer 407 may be less than the thickness t3 of the main metal layer 403. As an example, the thickness t7 of the first conductive layer 407 may be about 100 Å to about 2000 Å. In an embodiment, the thickness t7 of the first conductive layer 407 may be about 100 Å to about 1500 Å, about 100 Å to about 500 Å, or about 200 Å to about 300 Å. The thickness t7 of the first conductive layer 407 may be different from the thickness t1 of the auxiliary layer 401. In an embodiment, a difference between the thickness t7 of the first conductive layer 407 and the thickness t1 of the auxiliary layer 401 may be 1000 Å or less. In an embodiment, a difference between the thickness t7 of the first conductive layer 407 and the thickness t1 of the auxiliary layer 401 may be 500 Å or less, 300 Å or less, or 100 Å or less.

As shown in FIG. 4, the pad electrode 400 may be connected to the wiring 1100 (see FIG. 3), for example, the second portion 1102 of the wiring 1100 through a contact hole CNT formed in the second insulating layer IL2. A connection region of the pad electrode 400 and the second portion 1102 of the wiring 1100 may be covered by (or may overlap) a third insulating layer IL3 arranged on the pad electrode 400. In other words, the contact hole CNT for electrical connection between the pad electrode 400 and the second portion 1102 of the wiring 1100 may be covered by the third insulating layer IL3.

The third insulating layer IL3 may include an inorganic insulating material and/or an organic insulating material. In an embodiment, the third insulating layer IL3 may include an inorganic insulating material such as silicon oxide, silicon oxynitride, and/or silicon nitride. As an example, the third insulating layer IL3 may include a single layer of silicon nitride or a multi-layer including a silicon oxynitride layer and a silicon nitride layer thereon. The third insulating layer IL3 may cover the edges of the pad electrode 400 and cover the connection region of the pad electrode 400 and the second portion 1102 of the wiring 1100. The third insulating layer IL3 may include a first hole IL3-H that overlaps the pad electrode 400.

A fourth insulating layer IL4 may be arranged on the third insulating layer IL3. The fourth insulating layer IL4 may be a planarization insulating layer and may include an organic insulating material. The organic insulating material may include, for example, a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The fourth insulating layer IL4 may include a second hole IL4-H that overlaps the first hole IL3-H. The width of the second hole IL4-H of the fourth insulating layer IL4 may be different from the width of the first hole IL3-H. As an example, as shown in FIG. 4, the width of the second hole IL4-H may be less than the width of the first hole IL3-H.

The upper surface of the pad electrode 400 may be exposed to the outside through the first hole IL3-H and the second hole IL4-H. A printed circuit board or an integrated circuit element may be electrically connected to the pad electrode 400 exposed through the first hole IL3-H and the second hole IL4-H.

Figure 6:
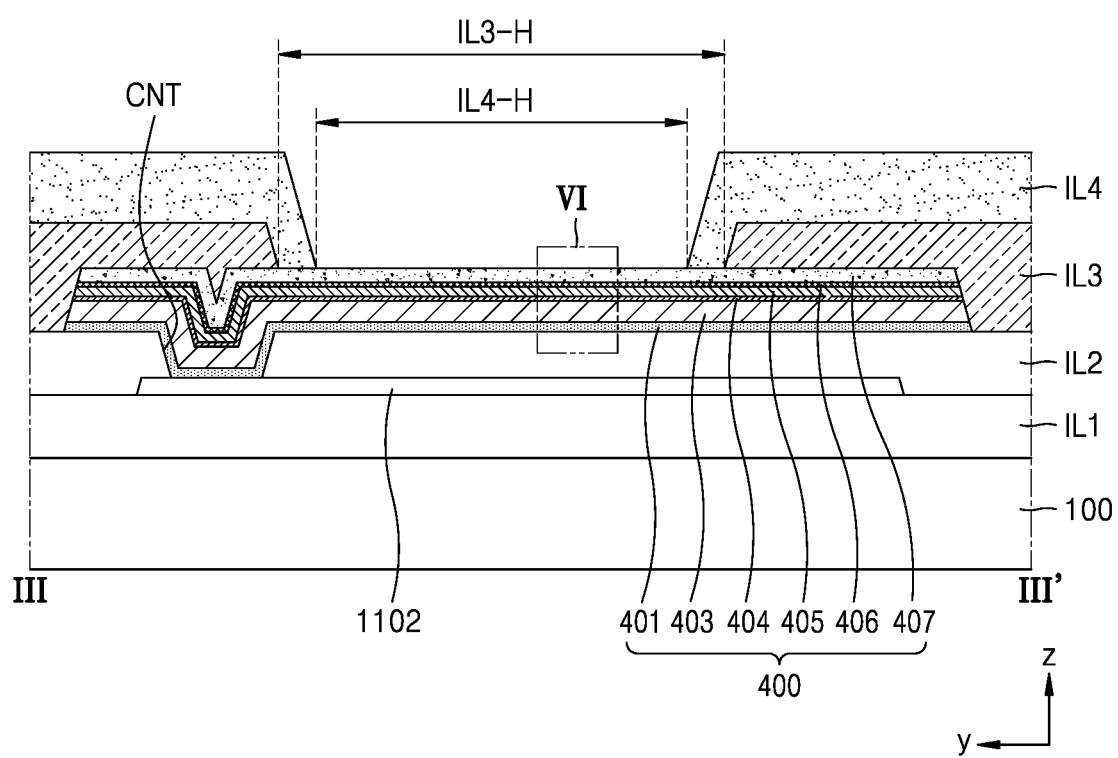
FIG. 6 is a schematic cross-sectional view of a pad electrode according to an embodiment, taken along line III-III' of FIG. 3.
Figure 7:
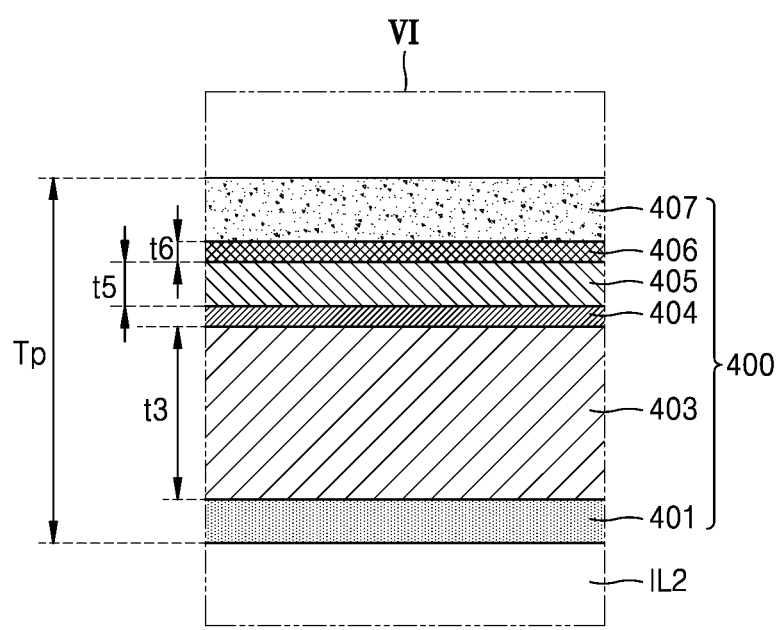
FIG. 7 is an enlarged schematic cross-sectional view of region VI of FIG. 6.

FIG. 6 is a schematic cross-sectional view of the pad electrode 400 according to an embodiment, taken along line III-III' of FIG. 3, and FIG. 7 is an enlarged schematic cross-sectional view of region VI of FIG. 6.

Referring to FIGS. 6 and 7, the pad electrode 400 may further include a second conductive layer 405 arranged below the first conductive layer 407.

The second conductive layer 405 may have a crystalline structure different from that of the first conductive layer 407 and prevent etchant from progressing toward the main metal layer 403 through pinholes that may be generated in the first conductive layer 407.

As an example, in the case where the first conductive layer 407 includes crystalline transparent conductive oxide such as indium tin oxide, the second conductive layer 405 arranged therebelow may serve as a barrier that may prevent etchants from progressing to the main metal layer 403 through pinholes that may be included in the crystalline transparent conductive oxide.

As an example, in the case where the first conductive layer 407 includes amorphous transparent conductive oxide such as zinc indium tin oxide, etchant may be prevented from damaging the main metal layer 403 through pinholes generated due to the crystallization. In the case where the second conductive layer 405 is further provided, the etchants may be even prevented from progressing toward the main metal layer 403 through unexpected paths.

The second conductive layer 405 may include a material different from those of the main metal layer 403 and the first conductive layer 407. As an example, the second conductive layer 405 may be a metal layer including a metal such as titanium (Ti), molybdenum (Mo), and/or tungsten (W). The second conductive layer 405 may have a single layer or a multi-layered structure including the above materials. In an embodiment, the second conductive layer 405 may have a single-layered structure such as a titanium layer, a molybdenum layer, or a tungsten layer. In another embodiment, the second conductive layer 405 may have a multi-layered structure in which the above-described layers may be stacked on each other. In an embodiment, though the second conductive layer 405 may include the same metal element (e.g., titanium) as the auxiliary layer 401, the second conductive layer 405 may include a metal element different from that of the auxiliary layer 401 in another embodiment.

The second conductive layer 405 may directly contact a layer thereunder. As an example, the lower surface of the second conductive layer 405 may directly contact the upper surface of the first oxide metal layer 404, and the interface between the second conductive layer 405 and the first oxide metal layer 404 may be easily viewed in the cross-section view.

A thickness t5 of the second conductive layer 405 may be less than the thickness t3 of the main metal layer 403. As an example, the thickness t5 of the second conductive layer 405 may be about 10 Å to about 1000 Å. In an embodiment, the thickness t5 of the second conductive layer 405 may be about 100 Å to about 500 Å.

In an embodiment, a second oxide metal layer 406 may be arranged between the second conductive layer 405 and the first conductive layer 407. As an example, the lower surface of the second oxide metal layer 406 may directly contact the upper surface of the second conductive layer 405. The upper surface of the second oxide metal layer 406 may directly contact the lower surface of the first conductive layer 407, and the interface between the second oxide metal layer 406 and the first conductive layer 407 may be viewed through a cross-sectional image.

The second oxide metal layer 406 may be a metal oxide including a second metal, and the second metal may be a metal element included in the second conductive layer 405 which may be a metal layer. As an example, in the case where the second conductive layer 405 includes titanium, the second oxide metal layer 406 may include titanium oxide ($TiO_x$).

Because the second conductive layer 405 and the second oxide metal layer 406 may include the same metal element (e.g., the second metal), the interface between the second conductive layer 405 and the second oxide metal layer 406 may be determined based on oxygen content. As an example, in case that a component is analyzed in a direction (the z-direction) from the second conductive layer 405 to the second oxide metal layer 406, a section in which oxygen content increases may correspond to the second oxide metal layer 406. In another method, the interface between the second conductive layer 405 and the second oxide metal layer 406 may be easily determined on an image of the cross-section.

A thickness t6 of the second oxide metal layer 406 may be about 5 Å to about 200 Å. As an example, the thickness t6 of the second oxide metal layer 406 may be about 10 Å to about 200 Å, or about 5 Å to about 100 Å, The thickness t6 of the second oxide metal layer 406 may be less than the thickness t5 of the second conductive layer 405. In an embodiment, the thickness t6 of the second oxide metal layer 406 may be about 10 Å to about 50 Å.

As shown in FIGS. 6 and 7, the pad electrode 400 may include the auxiliary layer 401, the main metal layer 403, the first oxide metal layer 404, the second conductive layer 405, the second oxide metal layer 406, and the first conductive layer 407. The auxiliary layer 401, the main metal layer 403, the first oxide metal layer 404, and the first conductive layer 407 may be the same as those described in FIGS. 4 and 5.

The pad electrode 400 including the above structure may be connected to the second portion 1102 of the wiring 1100 through the contact hole CNT formed in the second insulating layer IL2, and the third insulating layer IL3 may cover the edges of the pad electrode 400. As described above, the third insulating layer IL3 and the fourth insulating layer IL4 respectively may include the first hole IL3-H and the second hole IL4-H corresponding to the central portion of the pad electrode 400.

According to the embodiment described above with reference to FIGS. 4 to 7, though it is shown that a total thickness Tp of the pad electrode 400 may be relatively uniform, the thickness of the pad electrode 400 may be different for each region in another embodiment.

Figure 8:
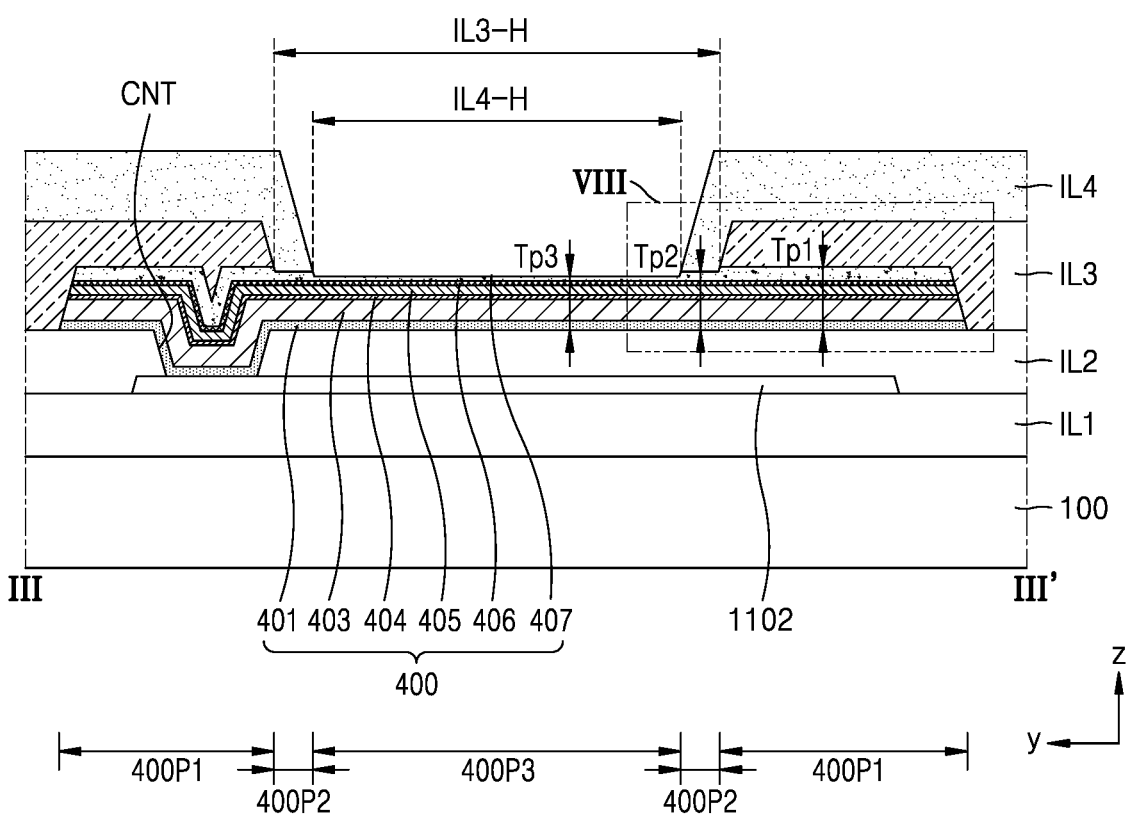
FIG. 8 is a schematic cross-sectional view of a pad electrode according to an embodiment, taken along line III-III' of FIG. 3.
Figure 9A:
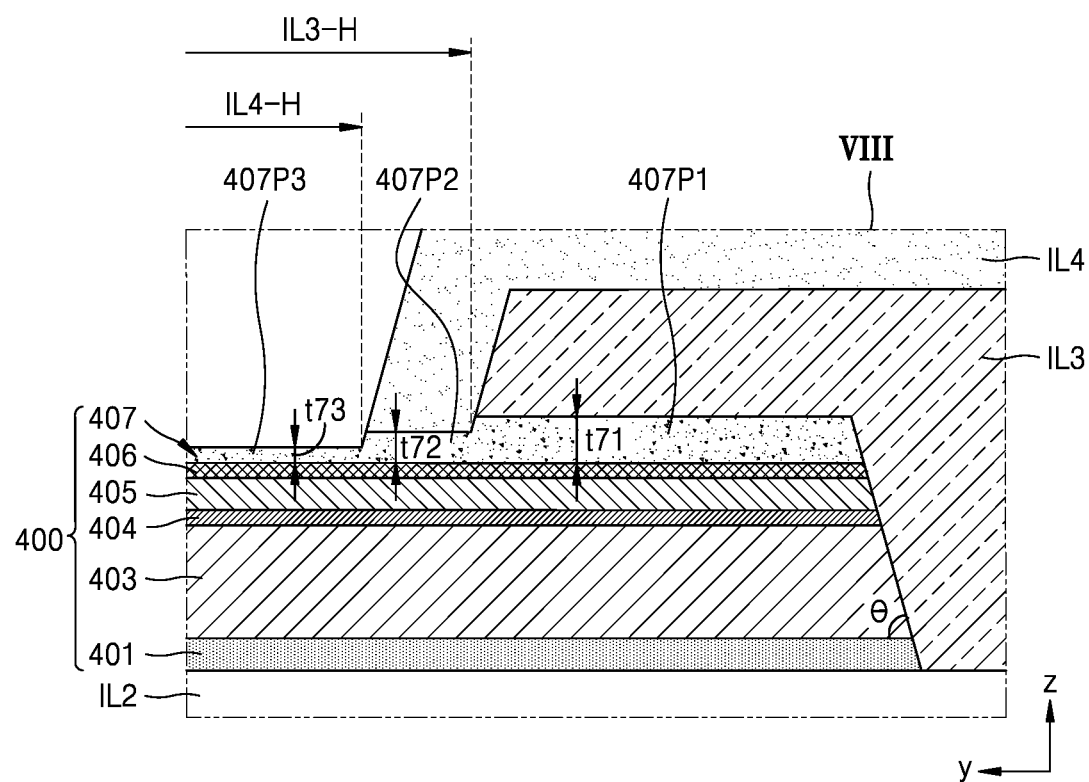
FIGS. 9A to 9D are enlarged schematic cross-sectional views of region VIII of FIG. 8.
Figure 9B:
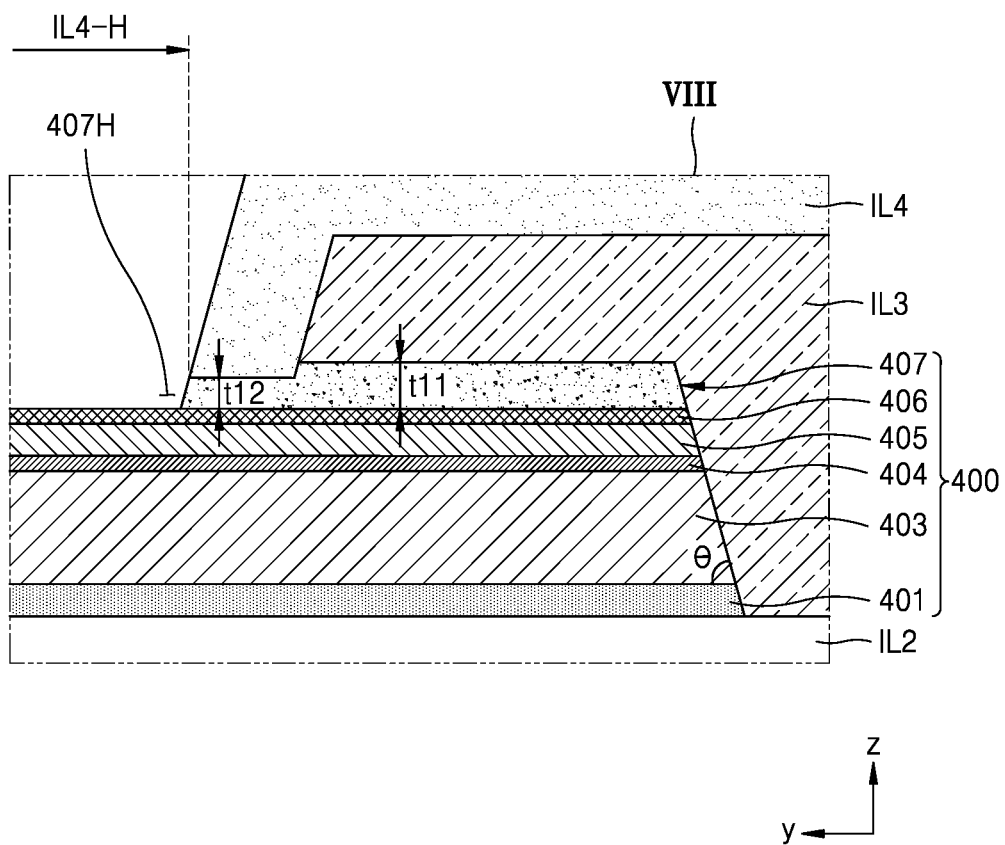
Figure 9C:
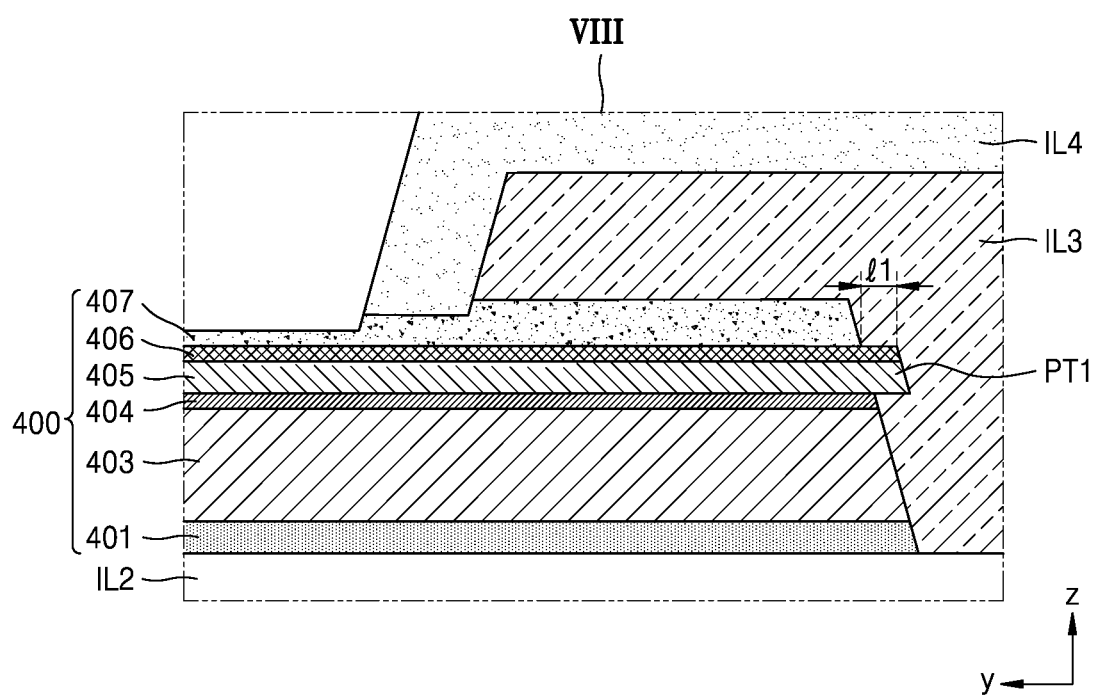
Figure 9D:
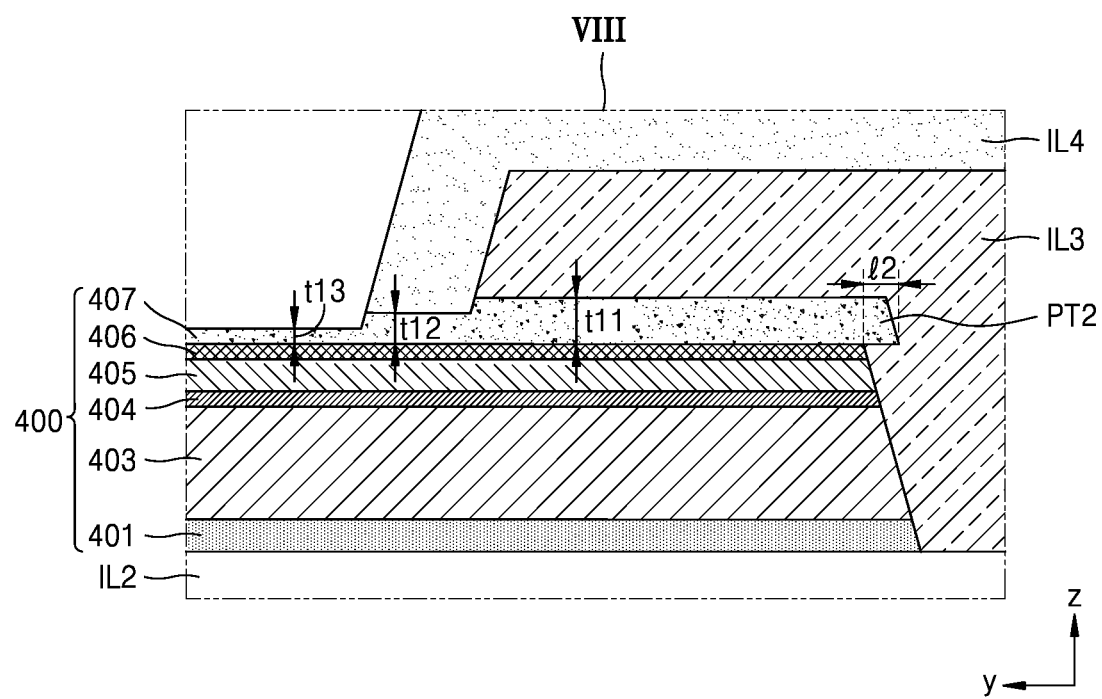

FIG. 8 is a schematic cross-sectional view of the pad electrode 400 according to an embodiment, taken along line III-III' of FIG. 3, and FIGS. 9A to 9D are enlarged schematic cross-sectional views of region VIII of FIG. 8. In an embodiment, it is shown in FIGS. 8 to 9D that the pad electrode 400 includes the auxiliary layer 401, the main metal layer 403, the first oxide metal layer 404, the second conductive layer 405, the second oxide metal layer 406, and the first conductive layer 407. The characteristics of the layers may be the same as those described above with reference to FIGS. 4 to 7.

Referring to FIG. 8, the pad electrode 400 may include an outer portion 400P1, a first inner portion 400P2, and a second inner portion 400P3, the first inner portion 400P2 and the second inner portion 400P3 being arranged inside the outer portion 400P1. The first inner portion 400P2 may be closer to the outer portion 400P1 than the second inner portion 400P3.

The outer portion 400P1 of the pad electrode 400 may overlap the third insulating layer IL3 and the fourth insulating layer IL4. The first inner portion 400P2 may overlap one of the third insulating layer IL3 and the fourth insulating layer IL4, for example, the fourth insulating layer IL4. The second inner portion 400P3 may overlap none of the third insulating layer IL3 and the fourth insulating layer IL4. In other words, the second inner portion 400P3 may simultaneously overlap the first hole IL3-H and the second hole IL4-H. The first inner portion 400P2 may overlap one (e.g., the first hole IL3-H) of the first hole IL3-H and the second hole IL4-H. The outer portion 400P1 may overlap none of the first hole IL3-H and the second hole IL4-H.

A thickness Tp1 of the outer portion 400P1 of the pad electrode 400 may be greater than a thickness Tp2 of the first inner portion 400P2, and a thickness Tp2 of the first inner portion 400P2 may be greater than a thickness Tp3 of the second inner portion 400P3. The thickness of each section of the pad electrode 400 may be influenced by the thickness of the first conductive layer 407.

Referring to FIG. 9A, the thickness of the first conductive layer 407 arranged on the uppermost of the pad electrode 400 may be different for each region. The first conductive layer 407 may include an outer portion 407P1, a first inner portion 407P2, and a second inner portion 407P3, which may respectively correspond to the outer portion 400P1, the first inner portion 400P2, and the second inner portion 400P3 of the pad electrode 400 described above with reference to FIG. 8.

The outer portion 407P1 of the first conductive layer 407 may overlap the third insulating layer IL3 and the fourth insulating layer IL4. The first inner portion 407P2 of the first conductive layer 407 may overlap one of the third insulating layer IL3 and the fourth insulating layer IL4, for example, the fourth insulating layer IL4. The second inner portion 407P3 of the first conductive layer 407 may overlap none of the third insulating layer IL3 and the fourth insulating layer IL4. In other words, the second inner portion 407P3 of the first conductive layer 407 may simultaneously overlap the first hole IL3-H and the second hole IL4-H, the first inner portion 407P2 of the first conductive layer 407 may overlap one (e.g., the first hole IL3-H) of the first hole IL3-H and the second hole IL4-H, and the outer portion 407P1 of the first conductive layer 407 may overlap none of the first hole IL3-H and the second hole IL4-H.

A thickness t71 of the outer portion 407P1 of the first conductive layer 407 may have the thickness t7 (see FIG. 5) described above with reference to FIG. 4. In contrast, a thickness t72 of the first inner portion 407P2 of the first conductive layer 407 may be less than the thickness t71 of the outer portion 407P1. The first hole IL3-H of the third insulating layer IL3 may be formed through etching. During the etching process of forming the first hole IL3-H, a portion of the first conductive layer 407 may be lost and the thickness t72 of the first inner portion 407P2 may be less than the thickness t71 of the outer portion 407P1.

A thickness t73 of the second inner portion 407P3 of the first conductive layer 407 may be less than the thickness t72 of the first inner portion 407P2. The second inner portion 407P3 of the first conductive layer 407 may be primarily lost during the etching process of forming the first hole IL3-H. The second inner portion 407P3 may be secondarily lost during the etching process of forming the pixel electrode of the display device. Accordingly, the thickness t73 of the second inner portion 407P3 may be less than the thickness t72 of the first inner portion 407P2 and the thickness t71 of the outer portion 407P1. In an embodiment, a portion corresponding to the second inner portion 407P3 may be removed. As shown in FIG. 9B, the first conductive layer 407 may include a third hole 407H. The size (or the width) of the third hole 407H of the first conductive layer 407 may be substantially the same as the size (or the width) of a second hole OL-H of a fourth insulating layer IL-4.

Referring to FIG. 9A, the lateral surface of the main metal layer 403 may include a forward tapered slope. A slope angle θ of the lateral surface may be about 30° to about 80°, or about 30° to about 75°. The above characteristic may be equally applicable to the main metal layer 403 of the pad electrode 400 described above with reference to FIGS. 4 to 7 and equally applicable to embodiments described below.

The pad electrode 400 having a multi-layered structure may have a forward tapered slope surface on the whole as shown in FIG. 9A. In the case where the pad electrode 400 includes a forward tapered slope surface, step coverage of the third insulating layer IL3 covering the edge of the pad electrode 400 may be improved, the third insulating layer IL3 being on the pad electrode 400.

In another embodiment, at least one of layers of the pad electrode 400 may include a tip that protrudes further in a lateral direction than the other neighboring layers. As an example, as shown in FIG. 9C, the second conductive layer 405 and/or the second oxide metal layer 406 may protrude further in a lateral direction (a (−) y-direction) than the first conductive layer 407 to constitute a first tip PT1. In another embodiment, as shown in FIG. 9D, the first conductive layer 407 may protrude further in a lateral direction (a (−) y-direction) than the main metal layer 403 and/or the second conductive layer 405 to constitute a second tip PT2.

Lengths l1 and l2 of the first tip PT1 and the second tip PT2 may be 0.2 μm or less. In the case where the lengths l1 and l2 of the first tip PT1 and the second tip PT2 exceed the above upper limit, the step coverage of the third insulating layer IL3, which may be an inorganic insulating layer, may be reduced. In an embodiment, the lengths l1 and l2 of the first tip PT1 and the second tip PT2 may be about 0.1 μm or less.

FIGS. 10A to 10E are schematic plan views of the pad electrode 400 and the wiring 1100 according to an embodiment.

As described above with reference to FIGS. 4, 6, and 8, the pad electrode 400 may be electrically connected to the wiring 1100 through the contact hole CNT and may overlap the first hole IL3-H of the third insulating layer IL3.

Figure 10A:
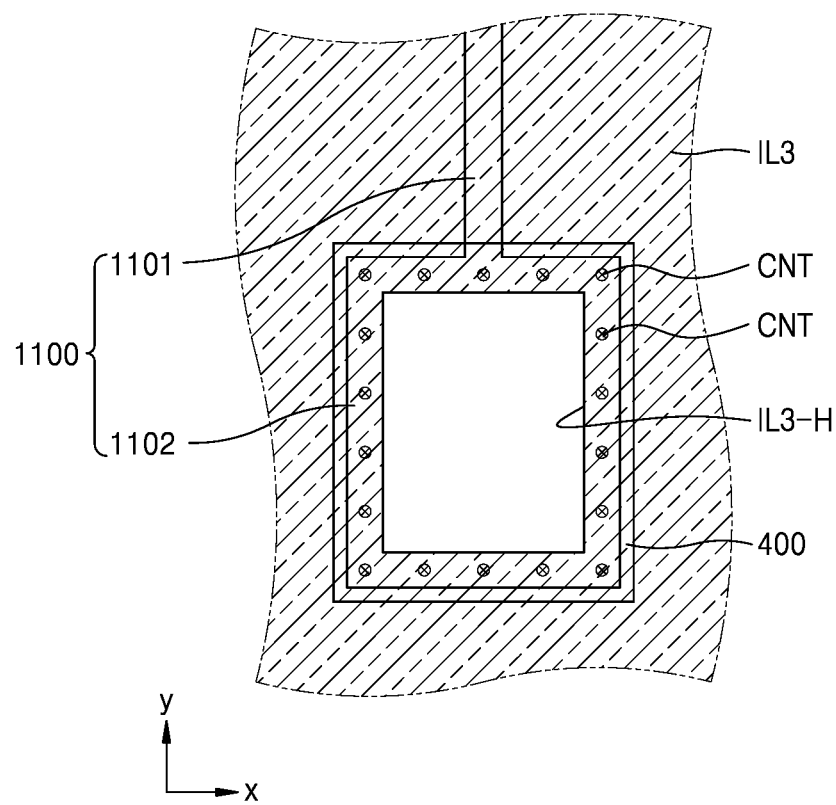
FIGS. 10A to 10E are schematic plan views of a pad electrode and a wiring, according to an embodiment.
Figure 10B:
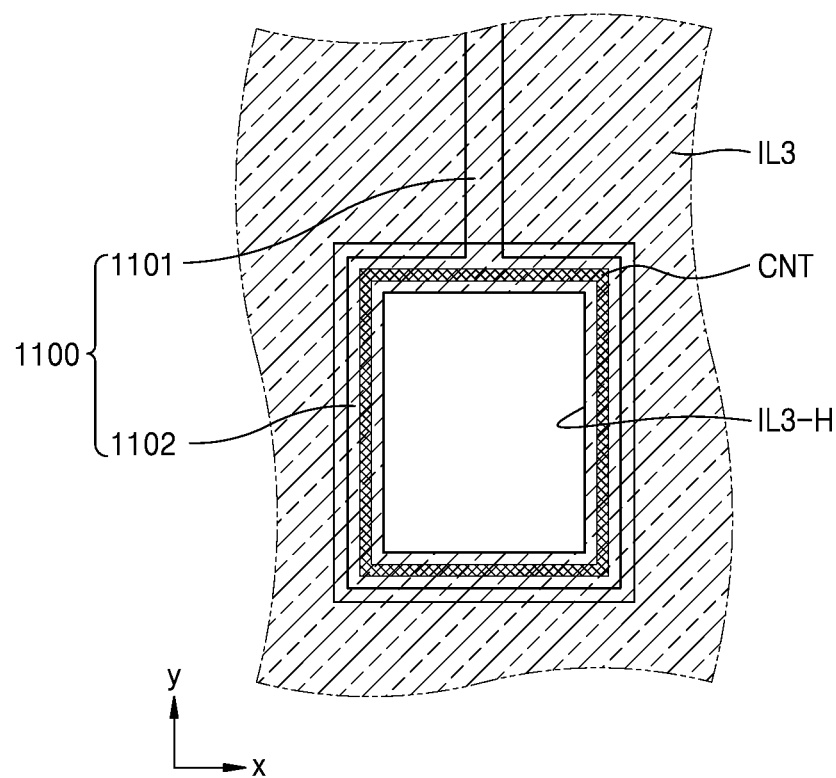
Figure 10C:
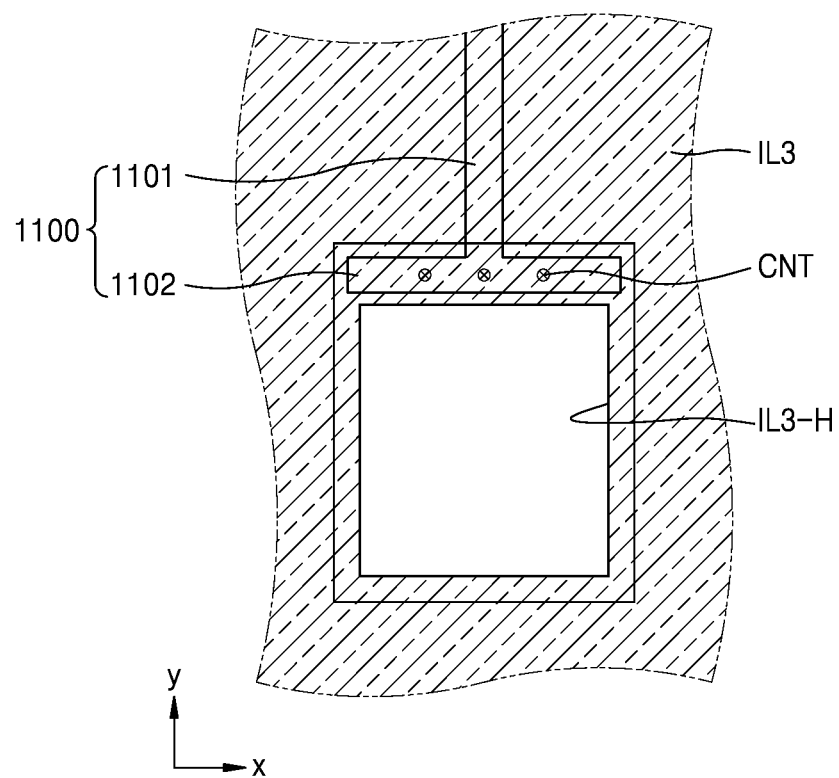

The contact hole CNT may be arranged as shown in FIGS. 10A to 10D. In an embodiment, as shown in FIG. 10A, contact holes CNT may be apart from each other in the outer portion of the pad electrode 400 along the edges of the pad electrode 400. In another embodiment, as shown in FIG. 10B, one contact hole CNT may extend in a closed loop shape along the edges of the pad electrode 400. In another embodiment, as shown in FIG. 10C, the contact holes CNT may be apart from each other along one edge of the pad electrode 400. As an example, the contact holes CNT may be arranged along an edge of the pad electrode 400 adjacent to the connection portion of the first portion 1101 and the second portion 1102 of the wiring 1100. In another embodiment, a contact hole CNT may be adjacent to an edge of the pad electrode 400 that may be adjacent to the connection portion of the first portion 1101 and the second portion 1102 of the wiring 1100. As shown in FIGS. 10A to 10D, the contact hole(s) may be covered by the third insulating layer IL3. The contact hole(s) may correspond to a connection portion between the wiring 1100 and the pad electrode 400.

Figure 10D:
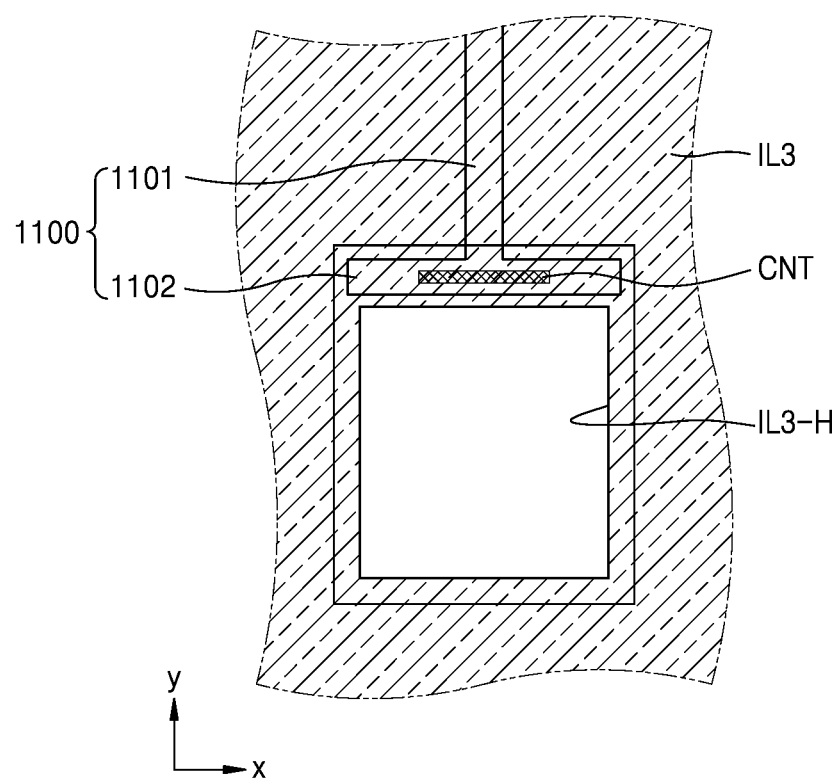

In the case where the contact hole CNT for connection of the pad electrode 400 and the wiring 1100 is adjacent to an edge of the pad electrode 400 as shown in FIGS. 10C and 10D, the second portion 1102 of the wiring 1100 shown in FIGS. 10C to 10D may have an area greater than that of the second portion 1102 of the wiring 1100 shown in FIGS. 10A and 10B. In an embodiment, the second portion 1102 of the wiring 1100 may entirely overlap the first hole IL3-H of the third insulating layer IL3 as shown in FIGS. 10A and 10B. In another embodiment, the second portion 1102 of the wiring 1100 may not overlap the first hole IL3-H of the third insulating layer IL3 or may overlap only a portion of the first hole IL3-H of the third insulating layer IL3 as shown in FIGS. 10C and 10D.

Figure 10E:
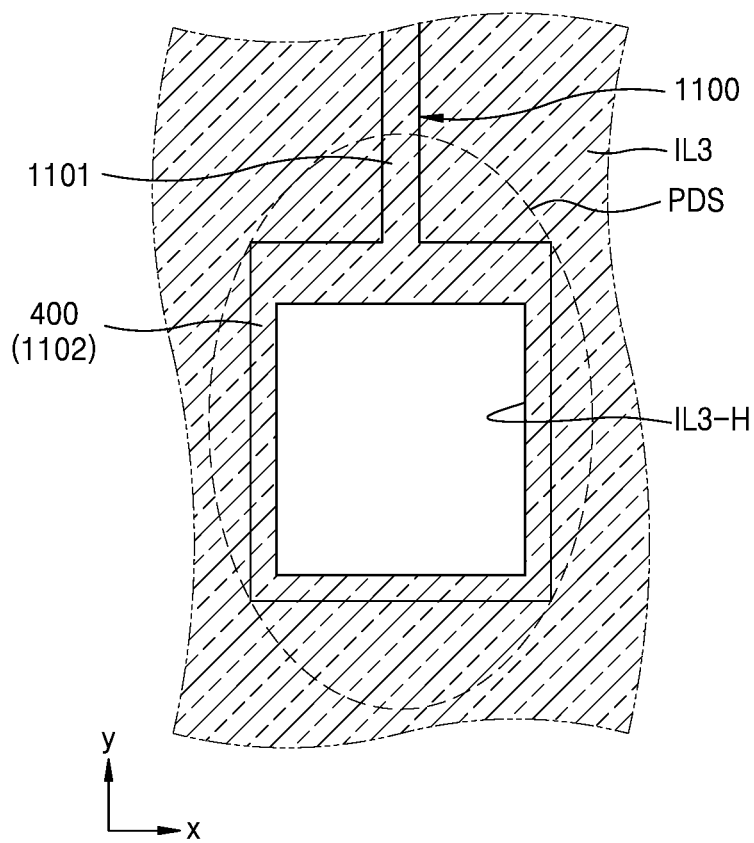

Referring to FIG. 10E, the pad electrode 400 may be formed as one body with the wiring 1100. As an example, an end of the first portion 1101 that corresponds to a body portion of the wiring 1100 may be the pad electrode 400. In other words, the second portion of the wiring 1100 may be the pad electrode 400. Though it is shown in the embodiment of FIG. 3 that the pad section PDS includes the structure in which the pad electrode 400 may overlap the second portion 1102 of the wiring 1100 (the structure of FIGS. 10A to 10D may be likewise), it is shown in FIG. 10E that the pad section PDS includes the structure in which the pad electrode 400 may be formed as one body with the wiring 1100. A contact hole for connection of the first portion 1101 of the wiring 1100 and the pad electrode 400 may not be separately provided. As described above, the edge of the pad electrode 400 may be covered by the third insulating layer IL3, and the third insulating layer IL3 may include the first hole IL3-H that may expose the pad electrode 400.

Figure 11:
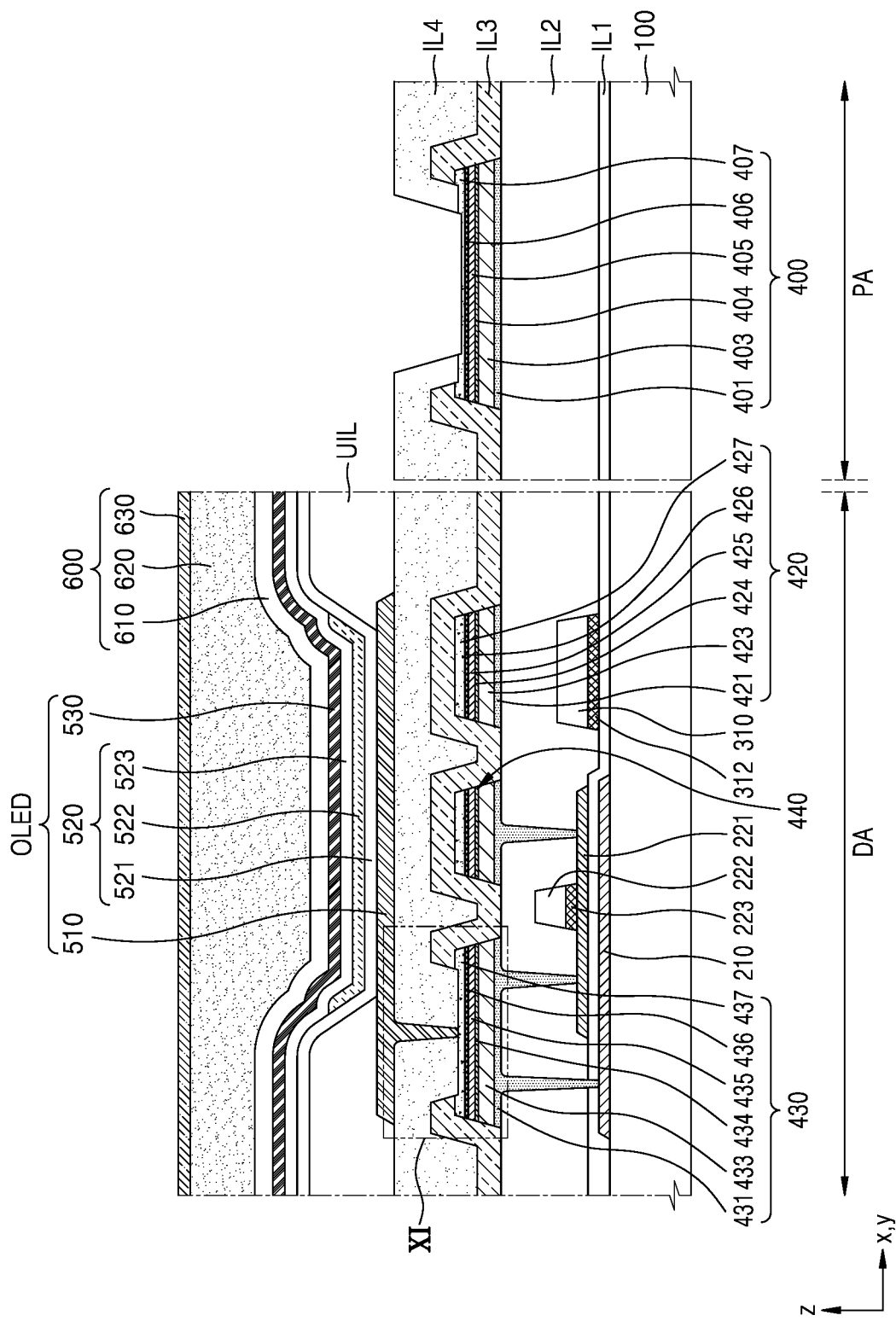
FIG. 11 is a schematic cross-sectional view of a display panel according to an embodiment.

FIG. 11 is a schematic cross-sectional view of a display panel according to an embodiment.

Referring to the peripheral area PA of FIG. 11, the pad electrode 400 may be arranged in the peripheral area PA. As described above with reference to FIGS. 8 and 9A, the pad electrode 400 may include the auxiliary layer 401, the main metal layer 403, the first oxide metal layer 404, the second conductive layer 405, the second oxide metal layer 406, and the first conductive layer 407. Though it is shown in FIG. 11 that the pad electrode 400 having the structure described with reference to FIGS. 8 and 9A, the embodiment is not limited thereto. As an example, the pad electrode 400 may have the same structure as the structure described with reference to FIGS. 8 to 9D, the pad electrode 400 and the wiring 1100 may have the structure described with reference to FIGS. 10A to 10E, and the descriptions of the characteristics thereof may be omitted.

Referring to the display area DA of FIG. 11, a transistor and a storage capacitor may be arranged in the display area DA.

The transistor may include a semiconductor layer 221, a gate electrode 222, a source electrode 430, and a drain electrode 440, the gate electrode 222 overlapping a channel region of the semiconductor layer 221, the source electrode 430 and the drain electrode 440 being respectively connected to a source region and a drain region of the semiconductor layer 221. The storage capacitor may include a first electrode 310 and a second electrode 420.

The semiconductor layer 221 of the transistor may include an oxide semiconductor. The oxide semiconductor may include at least one of indium gallium zinc oxide (IGZO), zinc tin oxide (ZTO), and zinc indium oxide (ZIO). In another embodiment, the semiconductor layer 221 may include polycrystalline silicon, amorphous silicon, and/or an organic semiconductor.

The gate electrode 222 of the transistor may overlap the channel region of the semiconductor layer 221 with a gate insulating layer 223 therebetween. The gate insulating layer 223 may be formed during the same mask process as a mask process of forming the gate electrode 222 and may have substantially the same planar shape as that of the gate electrode 222. The gate electrode 222 may include a conductive material including at least one of molybdenum (Mo), aluminum (Al), copper (Cu), and titanium (Ti) and may include a single layer or a multi-layer including the above materials. In an embodiment, the gate electrode 222 may have a multi-layered structure including a metal layer and a transparent conductive oxide layer, the metal layer including the above-described metal element, and the transparent conductive oxide layer being on the metal layer and including ITO. The gate insulating layer 223 may include an inorganic insulating material.

The first electrode 310 of the storage capacitor may be formed during the same process as a process of forming the gate electrode 222 and may include the same material as that of the gate electrode 222. An insulating layer 312 may be arranged under the first electrode 310, the insulating layer 312 including the same material as that of the gate insulating layer 223. Because the insulating layer 312 under the first electrode 310 may be formed together during the same mask process as a mask process of forming the first electrode 310, the planar shape of the insulating layer 312 may be substantially the same as that of the first electrode 310.

The source electrode 430 and the drain electrode 440 of the transistor, and the second electrode 420 of the storage capacitor may be simultaneously formed during a patterning process of forming the pad electrode 400. Accordingly, the source electrode 430 and the drain electrode 440 of the transistor, and the second electrode 420 of the storage capacitor may have a multi-layered structure as the pad electrode 400. With regard to this, it is shown in FIG. 11 that sub-layers 421, 423, 424, 425, 426, and 427 of the second electrode 420, sub-layers 431, 433, 434, 435, 436, and 437 of the source electrode 430, and sub-layers of the drain electrode 440 respectively may include the same materials as those of the auxiliary layer 401, the main metal layer 403, the first oxide metal layer 404, the second conductive layer 405, the second oxide metal layer 406, and the first conductive layer 407, which may be the sub-layers of the pad electrode 400.

The transistor may include a lower electrode 210 arranged below the semiconductor layer 221. The lower electrode 210 may be electrically connected to one of the source electrode 430 and the drain electrode 440. In an embodiment, it is shown in FIG. 11 that the lower electrode 210 may be electrically connected to the source electrode 430. The lower electrode 210 may be a kind of lower source electrode 430.

The lower electrode 210 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), and copper (Cu). In an embodiment, the lower electrode 210 may have a multi-layered structure including a metal layer and a transparent conductive oxide layer, the metal layer including the above-described metal element, and the transparent conductive oxide layer being on the metal layer and including ITO. The lower electrode 210 may improve the characteristics of the transistor.

The transistor may be electrically connected to a pixel electrode 510 arranged on the fourth insulating layer IL4. In an embodiment, as shown in FIG. 11, the pixel electrode 510 may be connected to the source electrode 430 or the drain electrode 440 of the transistor through a contact hole formed in the fourth insulating layer IL4.

The pixel electrode 510 may include a transparent conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the pixel electrode 510 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 510 may further include a layer on/under the reflective layer, the layer including ITO, IZO, ZnO, and/or $In_2O_3$. As an example, the pixel electrode 510 may have a three-layered structure in which an ITO layer, an Ag layer, and an ITO layer may be stacked on each other.

An upper insulating layer UIL may cover the edges of the pixel electrode 510 and expose the central portion of the pixel electrode 510. The upper insulating layer UIL may include an organic insulating material.

An intermediate layer 520 may include an emission layer 522 that may overlap the pixel electrode 510. The intermediate layer 520 may include a first functional layer 521 and/or a second functional layer 523, the first functional layer 521 being under the emission layer 522, and the second functional layer 523 being on the emission layer 522.

The first functional layer 521 may include a single layer or a multi-layer. For example, in the case where the first functional layer 521 includes a polymer material, the first functional layer 521 may include a hole transport layer (HTL), which has a single-layered structure, and may include poly(3,4-ethylenedioxythiophene) (PEDOT) or polyaniline (PANT). In the case where the first functional layer 521 includes a low molecular weight material, the first functional layer 521 may include a hole injection layer (HIL) and a hole transport layer (HTL).

The emission layer 522 may include a polymer organic material or a low-molecular weight organic material that emits light having a preset color. The second functional layer 523 may include an electron transport layer (ETL) and/or an electron injection layer (EIL).

An opposite electrode 530 may include a conductive material having a small work function. As an example, the opposite electrode 530 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. In another embodiment, the opposite electrode 530 may further include a layer on the (semi) transparent layer, the layer including ITO, IZO, ZnO, and/or $In_2O_3$.

An organic light-emitting diode OLED having a multi-layered structure including the pixel electrode 510, the intermediate layer 520, and the opposite electrode 530 may be covered by an encapsulation layer 600.

The encapsulation layer 600 may include at least one inorganic encapsulation layer and at least one organic encapsulation layer. In an embodiment, the encapsulation layer 600 may include a first inorganic encapsulation layer 610, an organic encapsulation layer 620, and a second inorganic encapsulation layer 630 that may be sequentially stacked on each other.

The first and second inorganic encapsulation layers 610 and 630 may each include at least one inorganic insulating material. The inorganic insulating material may include aluminum oxide, tantalum oxide, hafnium oxide, zinc oxide, silicon oxide, silicon nitride, and/or silicon oxynitride. The organic encapsulation layer 620 may include a polymer-based material. The polymer-based material may include an acryl-based resin, an epoxy-based resin, polyimide, and/or polyethylene. An acryl-based resin may include, for example, polymethylmethacrylate, poly acrylic acid, etc.

Figure 12:
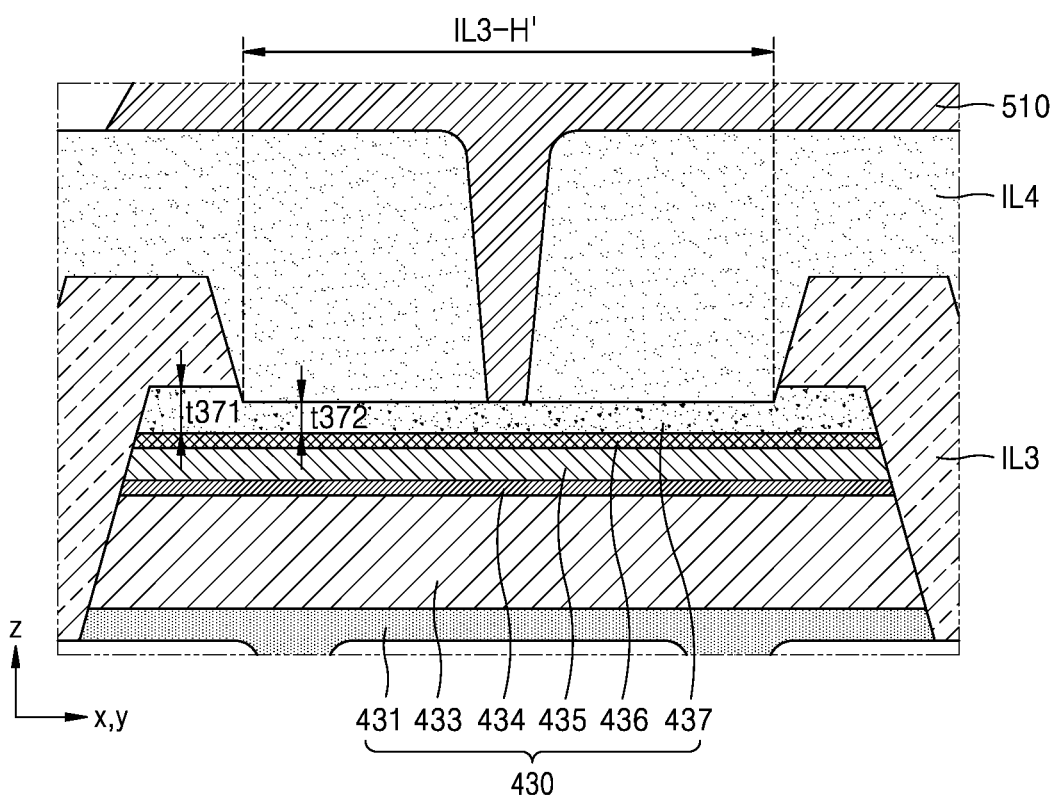
FIG. 12 is an enlarged schematic cross-sectional view of region XI of FIG. 11.

FIG. 12 is an enlarged schematic cross-sectional view of region XI of FIG. 11.

Referring to FIG. 12, an electrode of the transistor, for example, the source electrode 430 may include sub-layers 431, 433, 434, 435, 436, and 437. The sub-layers 431, 433, 434, 435, 436, and 437 may include the same materials as those of the sub-layers of the pad electrode 400 (see FIG. 8) as described above. As an example, the source electrode 430 may include an auxiliary sub-layer 431, a main sub-layer 433, a first oxide metal sub-layer 434, a second conductive protective sub-layer 435, a second oxide metal sub-layer 436, and a first conductive protective sub-layer 437. The materials of these layers may be respectively the same as those of the auxiliary layer 401, the main metal layer 403, the first oxide metal layer 404, the second conductive layer 405, the second oxide metal layer 406, and the first conductive layer 407 described above with reference to FIG. 8.

The thicknesses of the auxiliary sub-layer 431, the main sub-layer 433, the first oxide metal sub-layer 434, the second conductive protective sub-layer 435, and the second oxide metal sub-layer 436 may be substantially the same as those of the auxiliary layer 401, the main metal layer 403, the first oxide metal layer 404, the second conductive layer 405, the second oxide metal layer 406, respectively.

The first conductive protective sub-layer 437 of the source electrode 430 may have different thicknesses for each region and may be different from the first conductive layer 407 of the pad electrode 400 (see FIG. 8)

The first conductive protective sub-layer 437 may include an outer portion and an inner portion of the outer portion. The outer portion of the first conductive protective sub-layer 437 may overlap the third insulating layer IL3, and the inner portion may overlap a fourth hole IL3-H' of the third insulating layer IL3. The fourth hole IL3-H' may be designed for connection of the transistor and the pixel electrode 510 and may overlap the source electrode 430.

A thickness t371 of the outer portion of the first conductive protective sub-layer 437 may be greater than a thickness t372 of the inner portion. A portion of a material corresponding to the inner portion of the first conductive protective sub-layer 437 may be lost during a process of forming the fourth hole IL3-H', and accordingly, the thickness t372 of the inner portion of the first conductive protective sub-layer 437 may be less than the thickness t371 of the outer portion. Unlike the source electrode 430, the upper surface of the drain electrode 440 and the upper surface of the second electrode 420 of the storage capacitor may be covered by the third insulating layer IL3. The conductive protective sub-layer, which may be the uppermost layer of the drain electrode 440 and the uppermost layer of the second electrode 420 may have a relatively constant thickness regardless of a region.

Though, as described with reference to FIG. 9A, the first conductive layer 407 may include step differences due to three portions having different thicknesses, the first conductive protective sub-layer 437 may include step differences due to two portions having different thicknesses.

Though FIG. 12 describes the structure of the source electrode 430, the drain electrode 440 (see FIG. 11) may be connected to the pixel electrode 510 in another embodiment. The drain electrode 440 may have the structure described in FIG. 12.

Figure 13:
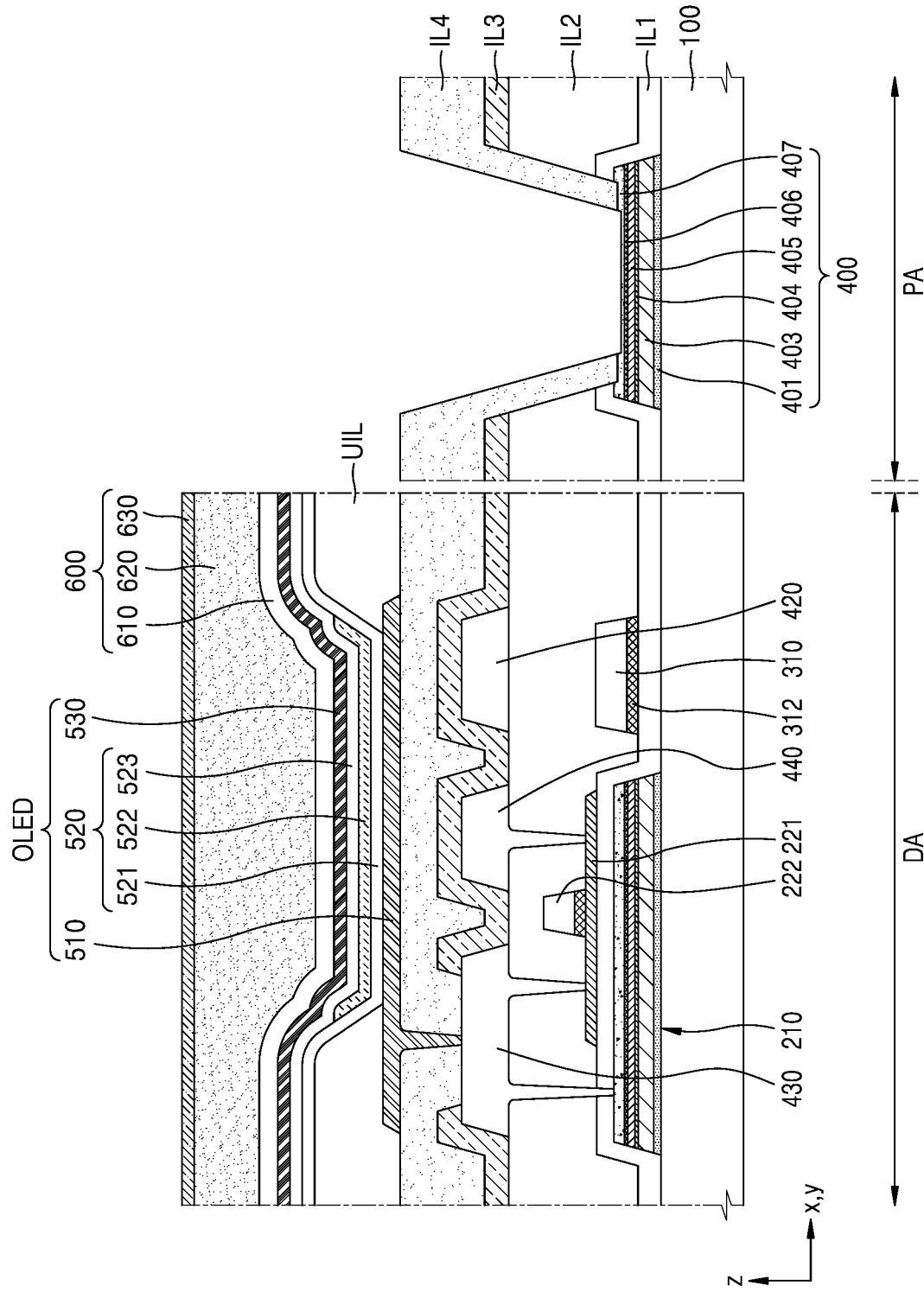
FIGS. 13 and 14 are schematic cross-sectional views of a display panel according to an embodiment.
Figure 14:
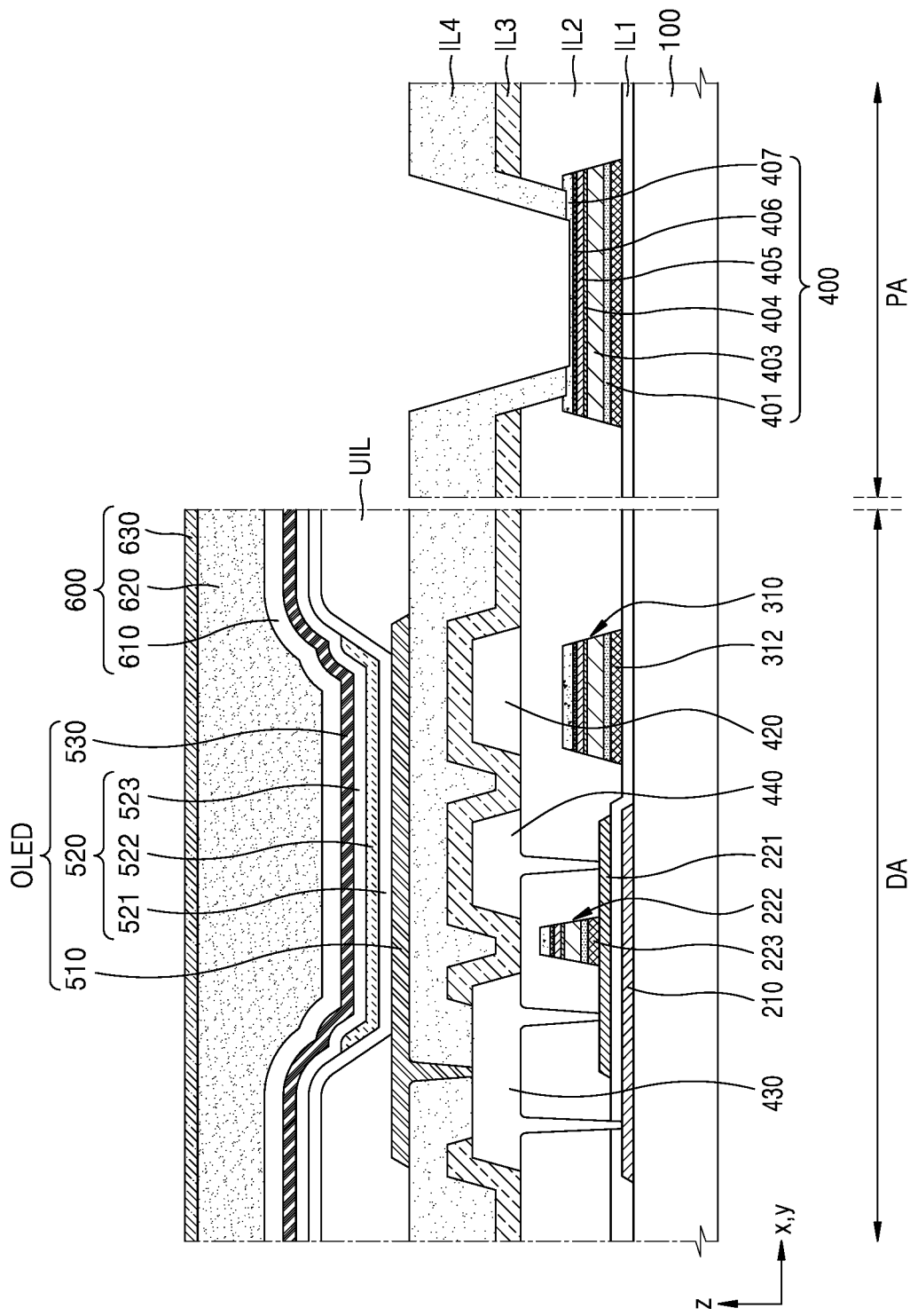

FIGS. 13 and 14 are schematic cross-sectional views of a display panel according to an embodiment.

Though it is shown in FIGS. 11 and 12 that the pad electrode 400 may be arranged on the same layer (e.g., the second insulating layer IL2) as the source electrode 430 and the drain electrode 440 of the transistor, and/or the second electrode 420 of the storage capacitor, the embodiment is not limited thereto.

As shown in FIG. 13, the pad electrode 400 may be arranged on the same layer (e.g., the substrate 100) as the lower electrode 210. The lower electrode 210 may include sub-layers as the pad electrodes 400. In another embodiment, as shown in FIG. 14, the pad electrode 400 may be arranged on the same layer (e.g. the first insulating layer IL1) as the gate electrode 222 of the transistor and/or the first electrode 310 of the storage capacitor. The gate electrode 222 of the transistor and/or the first electrode 310 of the storage capacitor may include sub-layers like the pad electrode 400.

Even though the pad electrode 400 may be arranged on the substrate 100 or the first insulating layer IL1 as shown in FIGS. 13 and 14, the characteristics described above with reference to FIGS. 4 to 9C may be equally applicable to the pad electrode 400 shown in FIGS. 13 and 14. For example, though it is shown in FIGS. 4 to 9C that the edges of the pad electrode 400 may be covered by the third insulating layer IL3 (see FIGS. 4 to 9C), which may be an inorganic insulating layer, the edges of the pad electrode 400 shown in FIGS. 13 and 14 may be covered by the first insulating layer IL1 or the second insulating layer IL2, which may be an inorganic insulating layer, and other characteristics may be the same as those described above.

Figure 15:
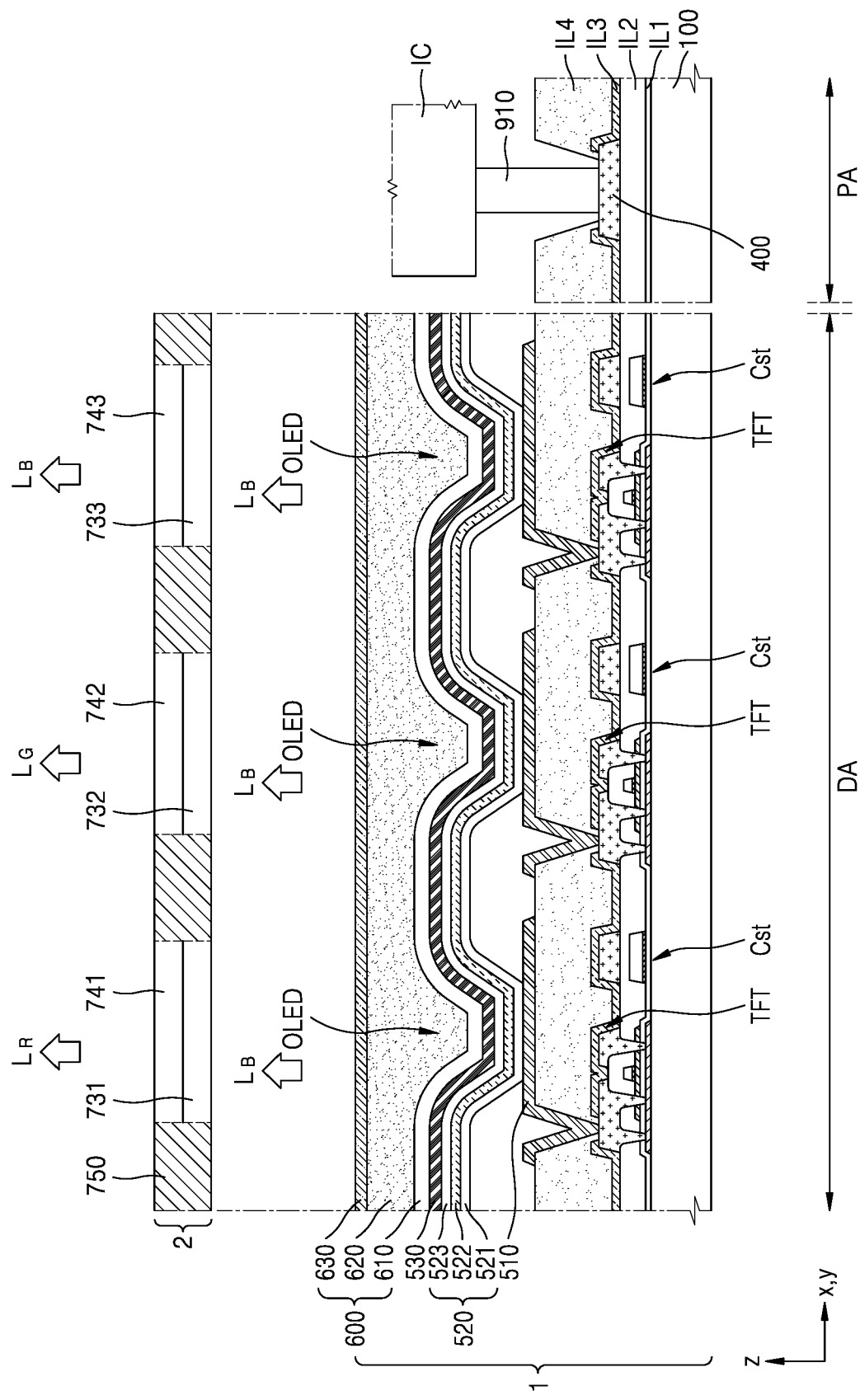
FIGS. 15 and 16 are schematic cross-sectional views of a display device according to an embodiment.
Figure 16:
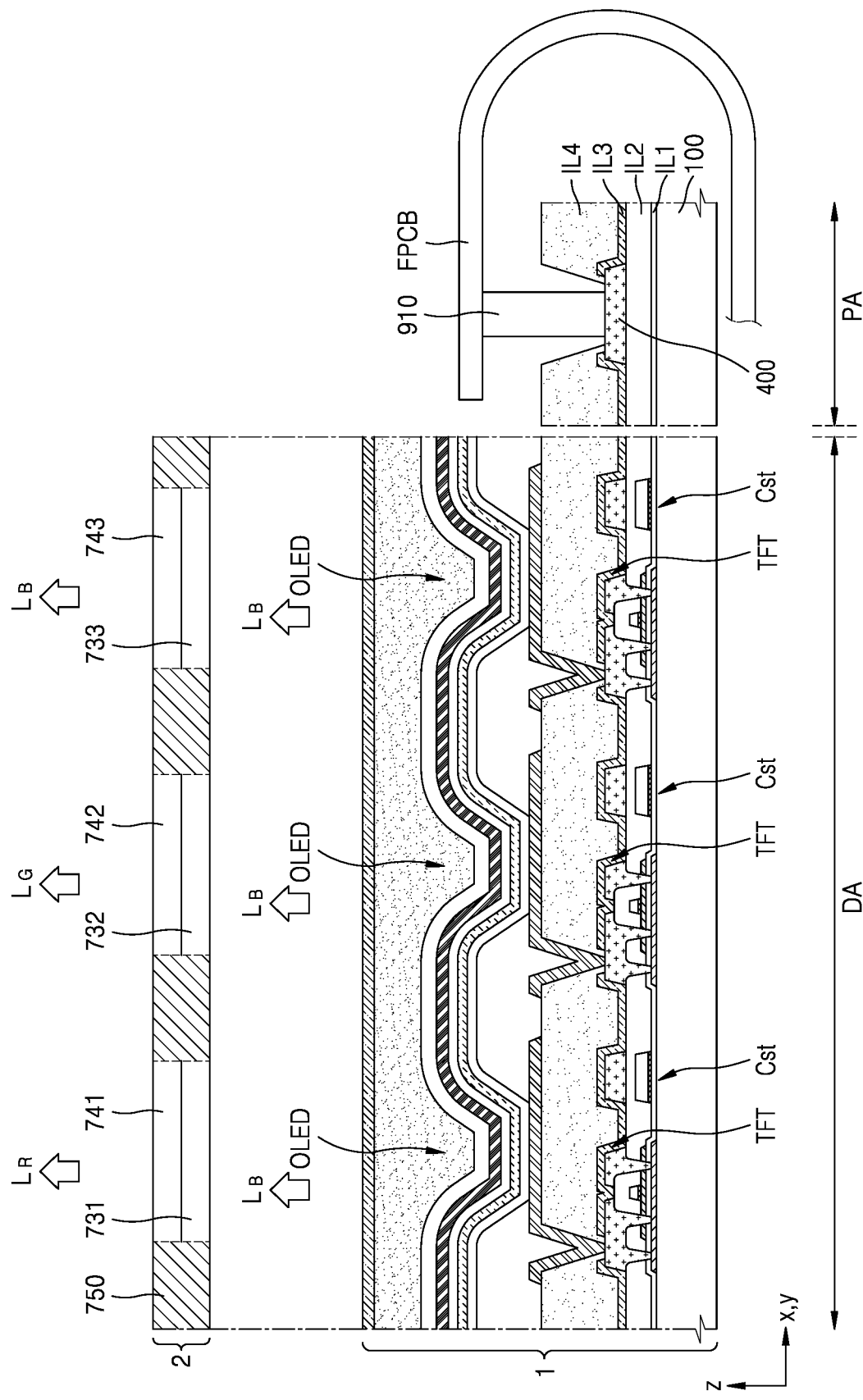

FIGS. 15 and 16 are schematic cross-sectional views of a display device according to an embodiment.

Referring to the display area DA of FIGS. 15 and 16, organic light-emitting diodes OLED of the display panel 1 may each be electrically connected to a thin-film transistor TFT and a storage capacitor Cst and may each emit light (e.g., blue light $L_B$). As an example, as shown in FIG. 15, each organic light-emitting diode OLED may include the pixel electrode 510, the intermediate layer 520, and the opposite electrode 530, the intermediate layer 520 including the first functional layer 521, the emission layer 522, and the second functional layer 523. The pixel electrodes 510 may be apart from each other to correspond to the configuration of the pixels. The first functional layer 521, the emission layer 522, and the second functional layer 523 of the intermediate layer 520 may each cover the pixel electrodes 510. Likewise, the opposite electrode 530 may cover the pixel electrodes 510. The organic light-emitting diodes OLED may be covered by an encapsulation layer 600. The encapsulation layer 600 may include the first inorganic encapsulation layer 610, the organic encapsulation layer 620, and the second inorganic encapsulation layer 630 as described above.

A portion of blue light $L_B$ emitted from the organic light-emitting diode OLED may be converted to red light $L_R$ or green light $L_G$ through a filter panel 2.

The filter panel 2 may include a first color converter 731 configured to convert blue light $L_B$ to red light $L_R$. Light converted by the first color converter 731 may be improved in color purity thereof while passing through a red color filter 741 and be emitted to the outside. The first color converter 731 may include quantum dots and scattering particles. The quantum dot may have a core-shell structure including a core and a shell, the core including nano crystals and the shell surrounding the core. A core of the quantum dot may be one of a Group II-Group VI compound, a Group II-Group V compound, a Group IV-Group VI compound, a Group IV element, a Group IV compound, and a combination thereof. The scattering particles may include $TiO_2$.

The filter panel 2 may include a second color converter 732 configured to convert blue light $L_B$ to green light $L_G$. Blue light $L_B$ emitted from the organic light-emitting diode OLED may be converted by the second color converter 732, and the converted light may be improved in color purity thereof while passing through a green color filter 742 and be emitted to the outside. The second color converter 732 may include quantum dots and scattering particles. The quantum dot may have a core-shell structure including a core and a shell, the core including nano crystals and the shell surrounding the core. A core of the quantum dot may be one of a Group II-Group VI compound, a Group III-Group V compound, a Group IV-Group VI compound, a Group IV element, a Group IV compound, and a combination thereof. The size and/or structure of the second color converter 732 may be different from the size and/or structure of the first color converter 731.

The filter panel 2 may include a transmission portion 733. Blue light $L_B$ emitted from the organic light-emitting diode OLED may be improved in color purity thereof while passing through the transmission portion 733 and a blue color filter 743 and be emitted to the outside. The transmission portion 733 may improve light efficiency by including scattering particles such as $TiO_2$.

There may be light-blocking portions 750 between two adjacent portions among the first color converter 731, the second color converter 732, and the transmission portion 733, and/or two adjacent color filters among the red color filter 741, the green color filter 742, and the blue color filter 743. The light-blocking portion 750 may include a black matrix.

Referring to the peripheral area PA of FIGS. 15 and 16, an integrated circuit (IC) may be arranged in the form of chip as shown in FIG. 15, or a flexible printed circuit board (FPCB) may be arranged, as an electronic structure, as shown in FIG. 16 over the pad electrode 400.

Referring to FIG. 15, the IC may include a data driver (or a scan driver) that may provide a data signal and be electrically connected to the pad electrode 400 through a conductive material layer 910.

The conductive material layer 910 may be a bump included in the IC. As an example, the bump provided to the lower end of the IC may be electrically connected to the pad electrode 400 by directly contacting the pad electrode 400. In another embodiment, the conductive material layer 910 may be a conductive adhesive layer such as an anisotropic conductive film. The bump of the IC may contact a conductive ball included in the conductive material layer 910, which may be an anisotropic conductive film, and the conductive ball may contact the pad electrode 400. Accordingly, the IC may be electrically connected to the pad electrode 400.

Referring to FIG. 16, the FPCB may be electrically connected to the pad electrode 400 through the conductive material layer 910 including an anisotropic conductive film. The FPCB may include a data driver, wirings, and a pixel structure. The FPCB may be bent such that a portion of the FPCB may be arranged on the backside of the substrate 100 of the display panel 1.

Figure 17:
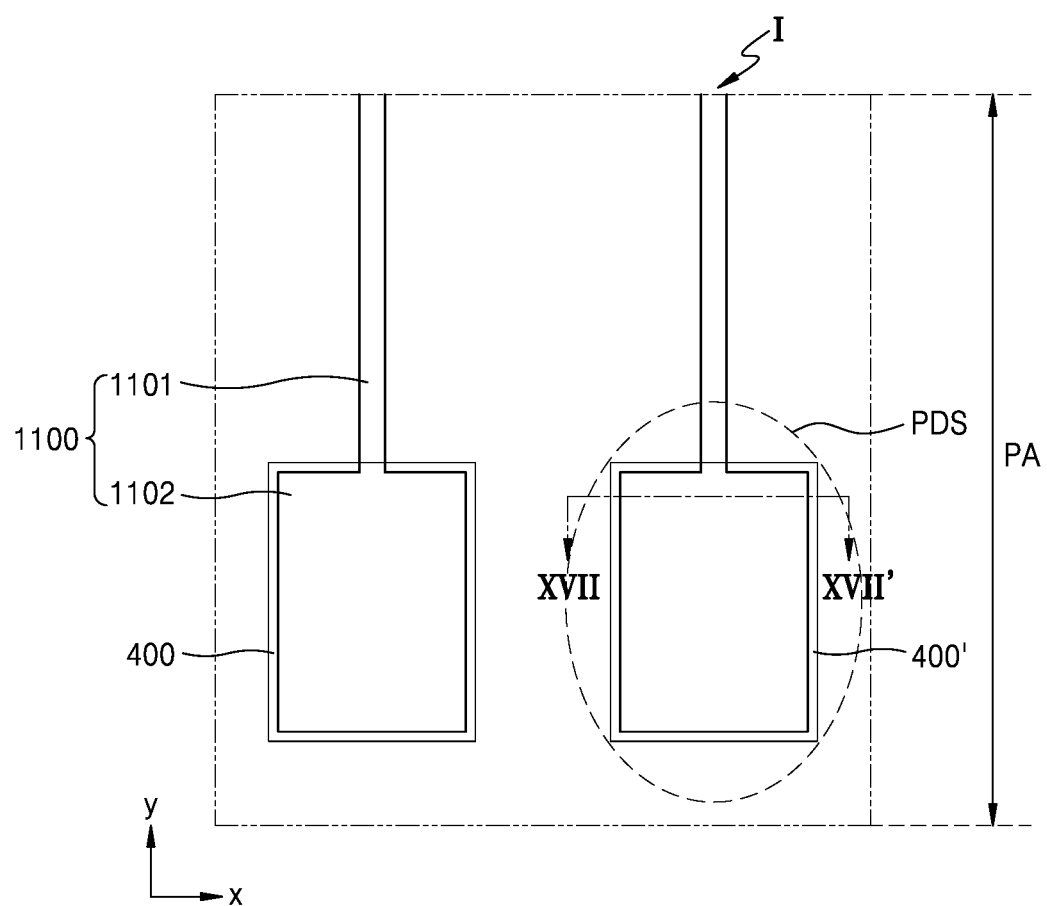
FIG. 17 is a schematic plan view of an outer region of a display device according to an embodiment, corresponding to region I of FIG. 1A.
Figure 18:
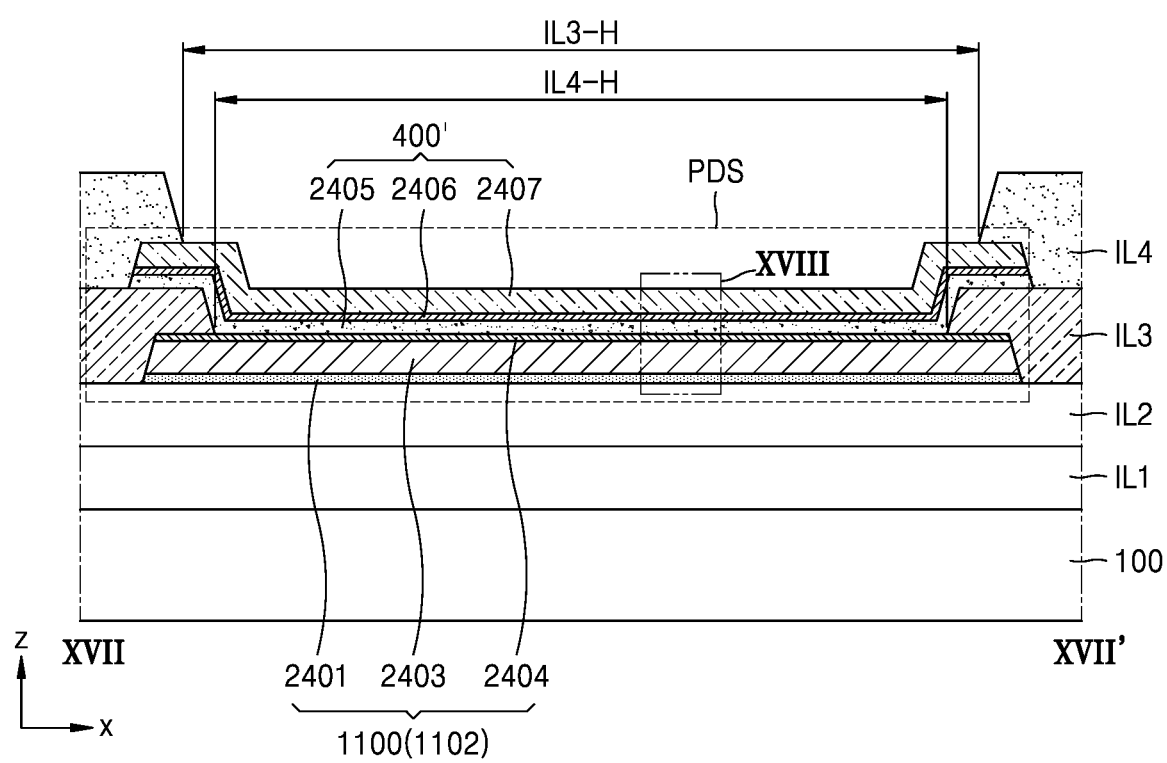
FIG. 18 is a schematic cross-sectional view of region I taken along line XVII-XVII' of FIG. 17.
Figure 19:
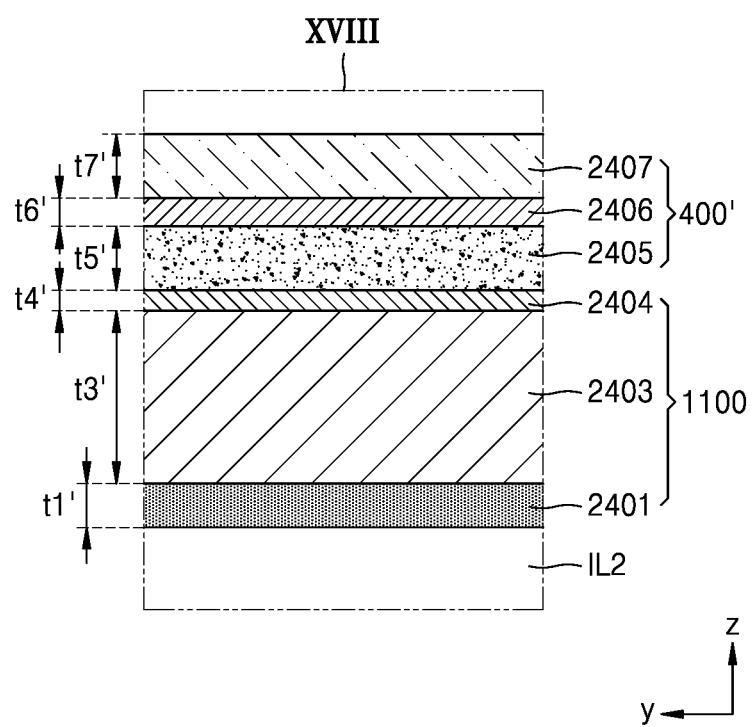
FIG. 19 is an enlarged schematic view of region XVIII of FIG. 18.

FIG. 17 is a schematic plan view of an outer region of a display device according to an embodiment and corresponds to region I of FIG. 1A, FIG. 18 is a schematic cross-sectional view of region I taken along line XVII-XVII' of FIG. 17, and FIG. 19 is an enlarged schematic view of region XVIII of FIG. 18.

Referring to FIGS. 17 and 18, the pad section PDS may include the pad electrode 400, and a pad electrode 400' may be electrically connected to the wiring 1100. In an embodiment, the pad section PDS may have a structure in which the pad electrode 400' may overlap the second portion 1102 of the wiring 1100.

The wirings 1100 may be arranged in the peripheral area PA and may include the first portion 1101 (or a body portion) and the second portion 1102 (or a connection portion), the first portion 1101 extending in one direction, and the second portion 1102 being arranged at the end of the first portion 1101.

The wiring 1100 and the pad electrode 400' may include a multi-layered structure. With regard to this, it is shown in FIG. 18 that the wiring 1100 and the pad electrode 400' each may include sub-layers. Referring to FIG. 18, the pad electrode 400 may be arranged over the substrate 100, and before the pad electrode 400 may be formed, at least one insulating layer, for example, the first and second insulating layers IL1 and IL2 may be formed on the substrate 100. The first and second insulating layers IL1 and IL2 may be the same as those described above with reference to FIG. 4.

As shown in FIG. 18, the wiring 1100 may include a main metal layer 2403, an auxiliary layer 2401, and an oxide metal layer 2404 (referred to as a first oxide metal layer, hereinafter), the auxiliary layer 2401 being under the main metal layer 2403, and the oxide metal layer 2404 being on the main metal layer 2403. The pad electrode 400' may include a first conductive layer 2407, a second conductive layer 2405, and an oxide metal layer (referred to as a second oxide metal layer 2406, hereinafter), the first conductive layer 2407 being on the uppermost layer of the pad electrode 400', the second conductive layer 2405 being below the first conductive layer 2407, and the second oxide metal layer 2406 being between the second conductive layer 2405 and the first conductive layer 2407.

In a direction (a z-direction) perpendicular to the upper surface of the substrate 100, as shown in FIGS. 18 and 19, the pad section PDS may have a stack structure of the auxiliary layer 2401, the main metal layer 2403, and the oxide metal layer 2404, the second conductive layer 2405, the second oxide metal layer 2406, and the first conductive layer 2407. The edges of the first oxide metal layer 2404 may be separated from the edges of the second conductive layer 2405 by the third insulating layer IL3 therebetween. In other words, the third insulating layer IL3 may be arranged between the wiring 1100 and the pad electrode 400', the third insulating layer IL3 including the first hole IL3-H.

The main metal layer 2403 of the wiring 1100 may be a sub-layer that occupies most of the wiring 1100 and/or the pad section PDS. As an example, a thickness t3' of the main metal layer 2403 may be 50% or more of the entire thickness of the wiring 1100 and/or be 50% or more of the entire thickness of the pad section PDS. The thickness t3' of the main metal layer 2403 may be about 1000 Å to about 15000 Å. As an example, the thickness t3' of the main metal layer 2403 may be about 1000 Å to about 14000 Å, about 3000 Å to about 14000 Å, or about 3000 Å to about 11000 Å.

The main metal layer 2403 may include copper (Cu), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), and/or molybdenum (Mo) considering conductivity. The main metal layer 2403 may include a single-layered structure or a multi-layered structure including the above materials. As an example, the main metal layer 2403 may include copper (Cu). In an embodiment, the main metal layer 2403 may include a single Cu layer.

The wiring 1100 may include the first oxide metal layer 2404 on the main metal layer 2403. The first oxide metal layer 2404 may include a metal oxide including a first metal. The first metal may be a metal element included in the main metal layer 2403. As an example, in the case where the main metal layer 2403 includes copper, the first oxide metal layer 2404 may include copper oxide ($CuO_x$). A thickness t4' of the first oxide metal layer 2404 may be about 5 Å to about 200 Å. In an embodiment, the thickness t4' of the first oxide metal layer 2404 may be about 10 Å to about 200 Å, about 5 Å to about 100 Å, or about 5 Å to about 30 Å.

The auxiliary layer 2401 may be arranged on the lower surface of the main metal layer 2403 and may improve adhesive force between the pad electrode 400 and the layer thereunder (e.g., the second insulating layer IL2).

The auxiliary layer 2401 may include a material different from that of the main metal layer 2403. The auxiliary layer 2401 may be a metal auxiliary layer including metal such as titanium (Ti) considering conductivity and adhesive force. In another embodiment, the auxiliary layer 2401 may include a transparent conductive oxide such as indium zinc oxide (IZO), gallium zinc oxide (GZO), and/or zinc indium oxide (ZIO). The transparent conductive oxide may be amorphous or crystalline.

A thickness t1' of the auxiliary layer 2401 may be less than a thickness t3' of the main metal layer 2403. As an example, the thickness t1' of the auxiliary layer 2401 may be in the range from about 10 Å to about 1000 Å. In an embodiment, the thickness t1' of the auxiliary layer 2401 may be about 50 Å to about 500 Å, about 50 Å to about 400 Å, or about 100 Å to about 300 Å.

The auxiliary layer 2401 and the main metal layer 2403 may be successively formed, and thus, the upper surface of the auxiliary layer 2401 may directly contact the lower surface of the main metal layer 2403. In an embodiment, the auxiliary layer 2401 may include titanium and the main metal layer 2403 may include copper. In the case where the auxiliary layer 2401 and the main metal layer 2403 include different materials, the interface between the auxiliary layer 2401 and the main metal layer 2403 may be viewed through the cross-sectional image of the pad electrode 2400.

The edges of the wiring 1100 may be covered by the third insulating layer IL3. The third insulating layer IL3 may include the first hole IL3-H that overlaps the wiring 1100. The pad electrode 400' may be electrically connected to the wiring 1100 through the first hole IL3-H of the third insulating layer IL3.

The first conductive layer 2407 of the pad electrode 400' may prevent the damage to the main metal layer 2403 during the etching process of forming the pixel electrode.

The auxiliary layer 2401 may include a transparent conductive oxide (TCO), which may be amorphous or crystalline. The amorphous TCO may include partially crystallized amorphous TCO. The first conductive layer 2407 may include indium tin oxide (ITO), indium zinc oxide (IZO), zinc oxide (ZnO), indium oxide ($In_2O_3$), indium gallium oxide (IGO), aluminum zinc oxide (AZO), and/or zinc indium tin oxide (ZITO).

The first conductive layer 2407 may be formed through a sputtering process. The first conductive layer 2407 formed through the sputtering process may include a small amount of pinholes, and a possibility that the main metal layer 403 may be damaged by the pinholes may be low. As an example, zinc indium tin oxide (ZITO) may be an amorphous material and may be in a partially crystallized amorphous state. In zinc indium tin oxide (ZITO), tin (Sn) content compared to zinc (Zn) and indium (In) content may be about 5 at % to about 25 at %, and more specifically, about 7 at % to about 15 at %. In the case where tin (Sn) content satisfies the above range, an appropriate etch rate may be secured with respect to etchant of the etching process of forming the pad electrode 400' and/or etchant of the etching process of forming the pixel electrode, chemical resistance may be secured, and the length of a tip to be formed on the pad electrode 400' may be easily controlled. In an embodiment, relative contents of zinc (Zn) and indium (In) among zinc indium tin oxide (ZITO) may be substantially the same, or indium (In) content may be greater than zinc (Zn).

In the case where the first conductive layer 2407 includes indium tin oxide (ITO), indium tin oxide (ITO) may be crystallized by a heat treatment process. The crystallized indium tin oxide (ITO) may be crystallized by a heat treatment process, and the crystallized indium tin oxide (ITO) may include pinholes. The pinholes may be a progression path of etchant directed to the main metal layer 2403, but the above issue may be prevented by arranging the second conductive layer 2405.

A thickness t7' of the first conductive layer 2407 may be less than the thickness t3' of the main metal layer 2403. As an example, the thickness t7' of the first conductive layer 2407 may be about 50 Å to about 1000 Å. In an embodiment, the thickness t7' of the first conductive layer 2407 may be about 100 Å to about 1000 Å, about 100 Å to about 500 Å, or about 200 Å to about 300 Å.

The second conductive layer 2405 may include a material different from those of the main metal layer 2403 and the first conductive layer 2407. As an example, the second conductive layer 2405 may be a metal layer including titanium (Ti), molybdenum (Mo), and/or tungsten (W). The second conductive layer 2405 may have a single-layered structure or a multi-layered structure including the above metals. In an embodiment, the second conductive layer 2405 may have a single-layered structure such as a Ti layer, a Mo layer, or a W layer. In another embodiment, the second conductive layer 2405 may have a multi-layered structure in which the above-described layers may be stacked on each other. In an embodiment, though the second conductive layer 2405 may include the same metal element (e.g., titanium) as that of the auxiliary layer 2401, the second conductive layer 2405 may include a metal element different from that of the auxiliary layer 2401.

The second conductive layer 2405 may directly contact the layer thereunder. As an example, the lower surface of the second conductive layer 2405 may directly contact the upper surface of the wiring 1100, for example, the upper surface of the first oxide metal layer 404.

A thickness t5' of the second conductive layer 2405 may be less than the thickness t3' of the main metal layer 2403. As an example, the thickness t5' of the second conductive layer 2405 may be about 10 Å to about 1000 Å. In an embodiment, the thickness t5' of the second conductive layer 2405 may be about 50 Å to about 1000 Å, or about 100 Å to about 500 Å.

In an embodiment, the second oxide metal layer 2406 may be arranged between the second conductive layer 2405 and the first conductive layer 2407. The second oxide metal layer 2406 may be a metal oxide including a second metal. The second metal may be a metal element included in the second conductive layer 2405. As an example, in the case where the second conductive layer 2405 includes titanium, the second oxide metal layer 2406 may include titanium oxide ($TiO_x$).

The lower surface of the second oxide metal layer 2406 may directly contact the upper surface of the second conductive layer 2405. The upper surface of the second oxide metal layer 2406 may directly contact the lower surface of the first conductive layer 2407. The interface between the second oxide metal layer 2406 and the first conductive layer 2407s may be viewed through the cross-sectional image thereof.

A thickness t6' of the second oxide metal layer 2406 may be about 5 Å to about 200 Å. The thickness t6' of the second oxide metal layer 2406 may be about 10 Å to about 200 Å, or about 5 Å to about 100 Å. The thickness t6' of the second oxide metal layer 2406 may be less than the thickness t5' of the second conductive layer 2405.

As described above, the pad electrode 400' may have a stack structure of the first conductive layer 2407, the second oxide metal layer 2406, and the second conductive layer 2405. As a comparative example, the pad electrode 400' may include a single layer of the first conductive layer 2407, the thickness of the pad electrode 400' remarkably increases, and it may be difficult to control particles (e.g. particles including an element constituting the second conductive layer 2407) that may occur during the process of manufacturing the display device. As another comparative example, in the case where the pad electrode 400' includes the second oxide metal layer 2406 and the second conductive layer 2405 and may not include the first conductive layer 2407, there may be a resistance increase issue due to the second oxide metal layer 2406. However, according to an embodiment, because the pad electrode 400' has a stack structure of the first conductive layer 2407, the second oxide metal layer 2406, and the second conductive layer 2405, the thickness of the pad electrode 400' may be prevented from increasing and the resistance of the pad electrode 400' may be reduced.

Figure 20:
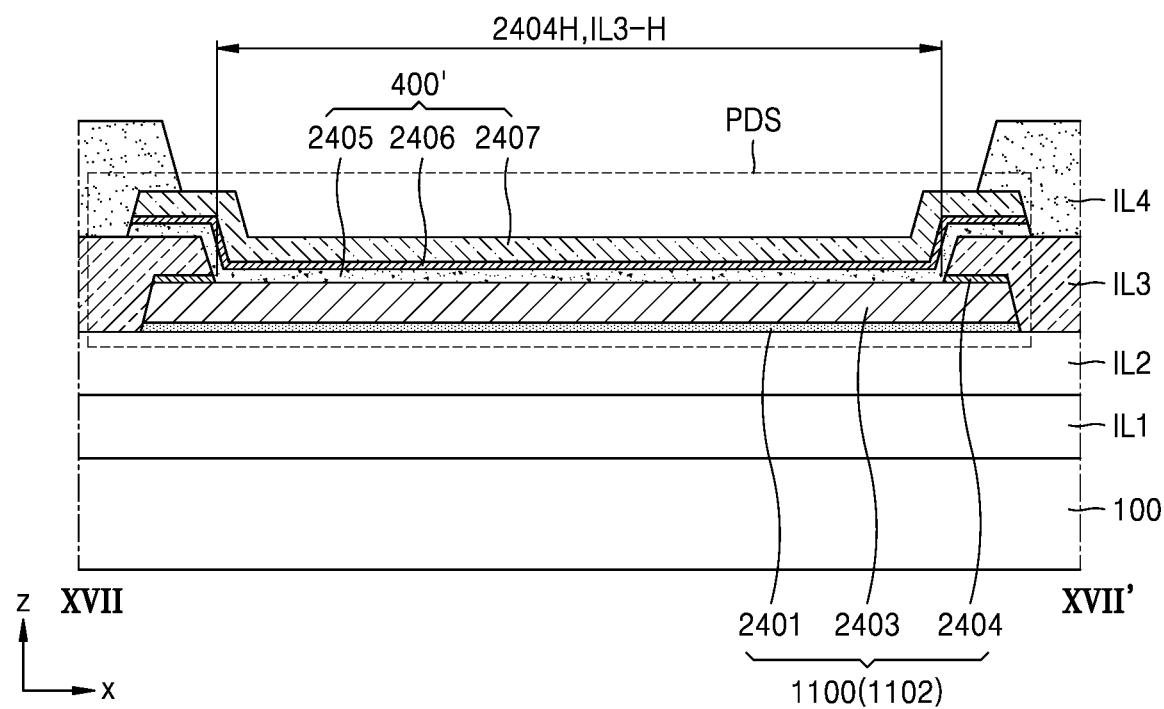
FIG. 20 is a schematic cross-sectional view of a pad electrode according to an embodiment, taken along line XVII-XVII' of FIG. 17.

FIG. 20 is a schematic cross-sectional view of a pad electrode according to an embodiment, taken along line XVII-XVII' of FIG. 17.

As described above with reference to FIGS. 18 and 19, the pad section PDS may have an overlapping structure in which the wiring 1100, for example, the second portion 1102 of the wiring 1100 may overlap the pad electrode 400', the wiring 1100 may include the auxiliary layer 2401, the main metal layer 2403, and the first oxide metal layer 2404, and the pad electrode 400' may include the second conductive layer 2405, the second oxide metal layer 2406, and the first conductive layer 2407.

In an embodiment, as shown in FIG. 20, the first oxide metal layer 2404 may include a hole 2404H. The main metal layer 2403 may directly contact the second conductive layer 2405 through the hole 2404H of the first oxide metal layer 2404. The hole 2404H of the first oxide metal layer 2404 may have substantially the same size (or width) of that of the first hole IL3-H of the third insulating layer IL3.

Figure 21:
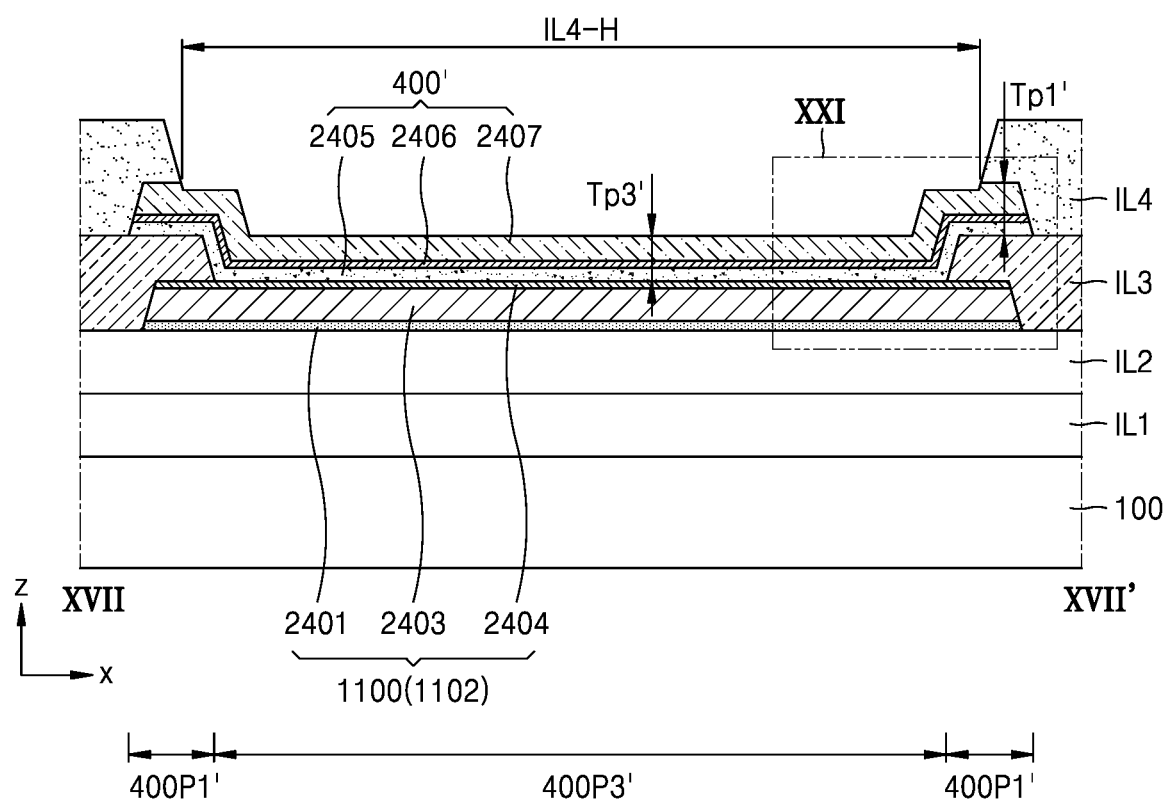
FIG. 21 is a schematic cross-sectional view of a pad electrode according to an embodiment, taken along line XVII-XVII' of FIG. 17.
Figure 22:
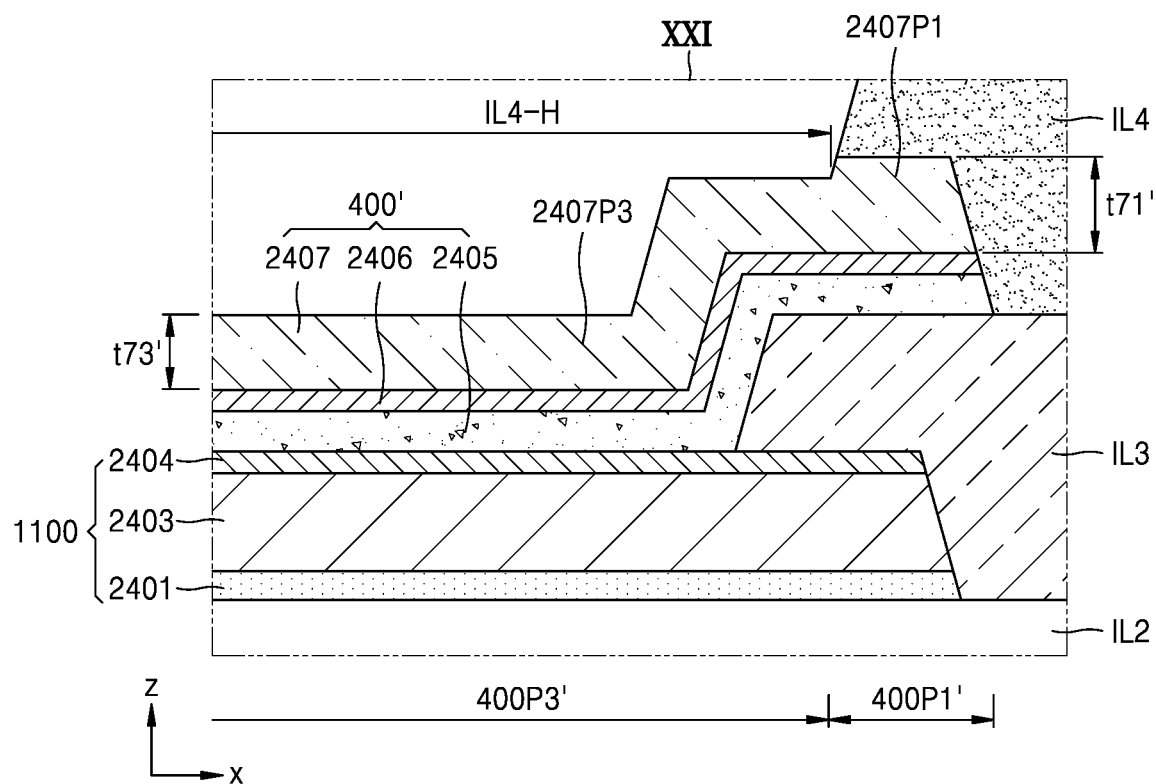
FIG. 22 is an enlarged schematic cross-sectional view of region XXI of FIG. 21.

FIG. 21 is a schematic cross-sectional view of a pad electrode according to an embodiment, taken along line XVII-XVII' of FIG. 17, and FIG. 22 is an enlarged schematic cross-sectional view of region XXI of FIG. 21.

According to the embodiment described with reference to FIGS. 18 to 20, though it is shown that the thickness of the pad electrode 400' may be relatively uniform, the thickness of the pad electrode 400' may be different for each region as shown in FIG. 21 in another embodiment.

Referring to FIGS. 21 and 22, the pad electrode 400' may include an outer portion 400P1' and an inner portion 400P3' inside the outer portion 400P1'.

The outer portion 400P1' of the pad electrode 400' may overlap the fourth insulating layer IL4. The inner portion 400P3' may not overlap the fourth insulating layer IL4.

A thickness Tp1' of the outer portion 400P1' of the pad electrode 400' may be greater than a thickness Tp3' of the inner portion 400P3'. A thickness difference between the pad electrode 400' and the inner portion 400P3' may depend on a thickness difference for each region of the first conductive layer 2407.

Referring to FIG. 22, the first conductive layer 2407 arranged on the uppermost layer of the pad electrode 400' may have different thicknesses for each region. The first conductive layer 2407 may include an outer portion 2407P1 and an inner portion 2407P3, which may respectively correspond to the outer portion 400P1' and the inner portion 400P3' of the pad electrode 400' described above with reference to FIG. 21.

The outer portion 2407P1 of the first conductive layer 2407 may overlap the fourth insulating layer IL4, and the inner portion 2407P3 may not overlap the fourth insulating layer IL4. In other words, the inner portion 2407P3 may overlap the second hole IL4-H of the fourth insulating layer IL4.

A thickness t71' of the outer portion 2407P1 of the first conductive layer 2407 may have the thickness t7' (see FIG. 19) described above with reference to FIG. 19. In contrast, a thickness t73' of the inner portion 2407P3 of the first conductive layer 2407 may be less than the thickness t71' of the outer portion 2407P1. The inner portion 2407P3 may have the thickness less than that of the outer portion 2407P1 while a portion of the first conductive layer 2407 may be lost during a process of forming the second hole IL4-H.

Figure 23A:
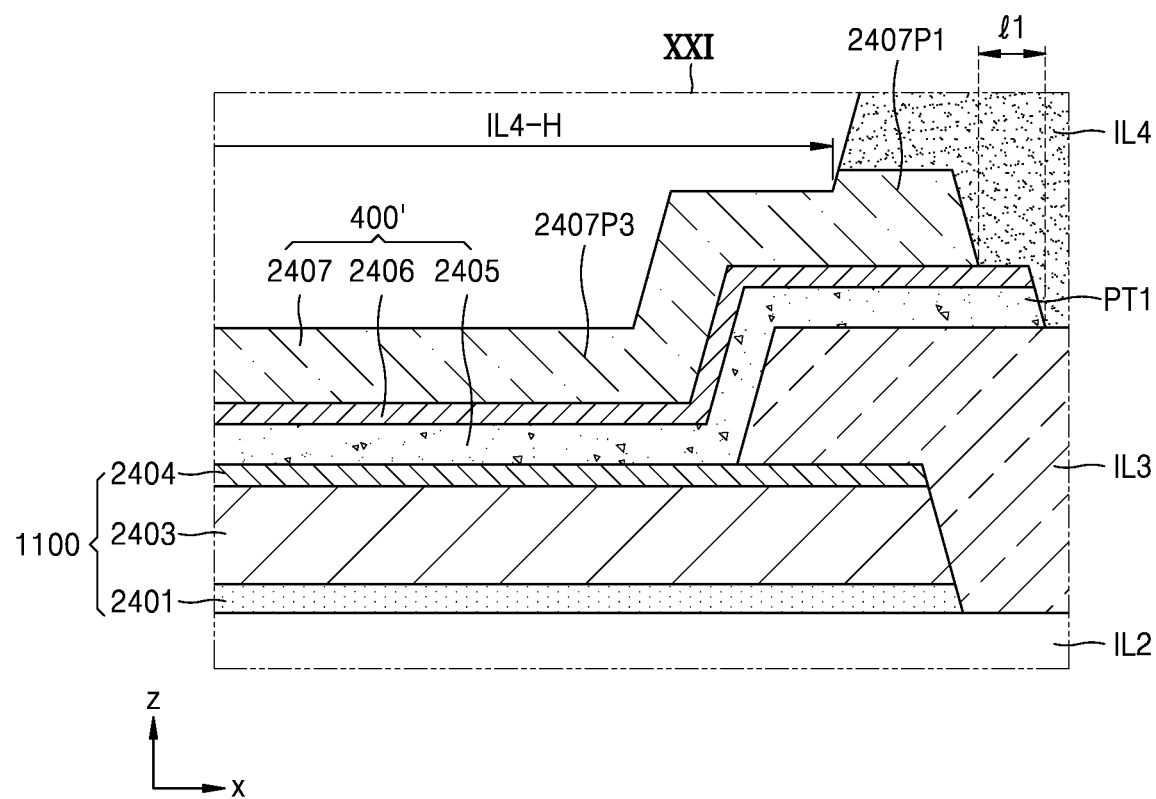
FIGS. 23A and 23B are schematic cross-sectional views of a pad electrode according to an embodiment and enlarged views of region XXI of FIG. 21.
Figure 23B:
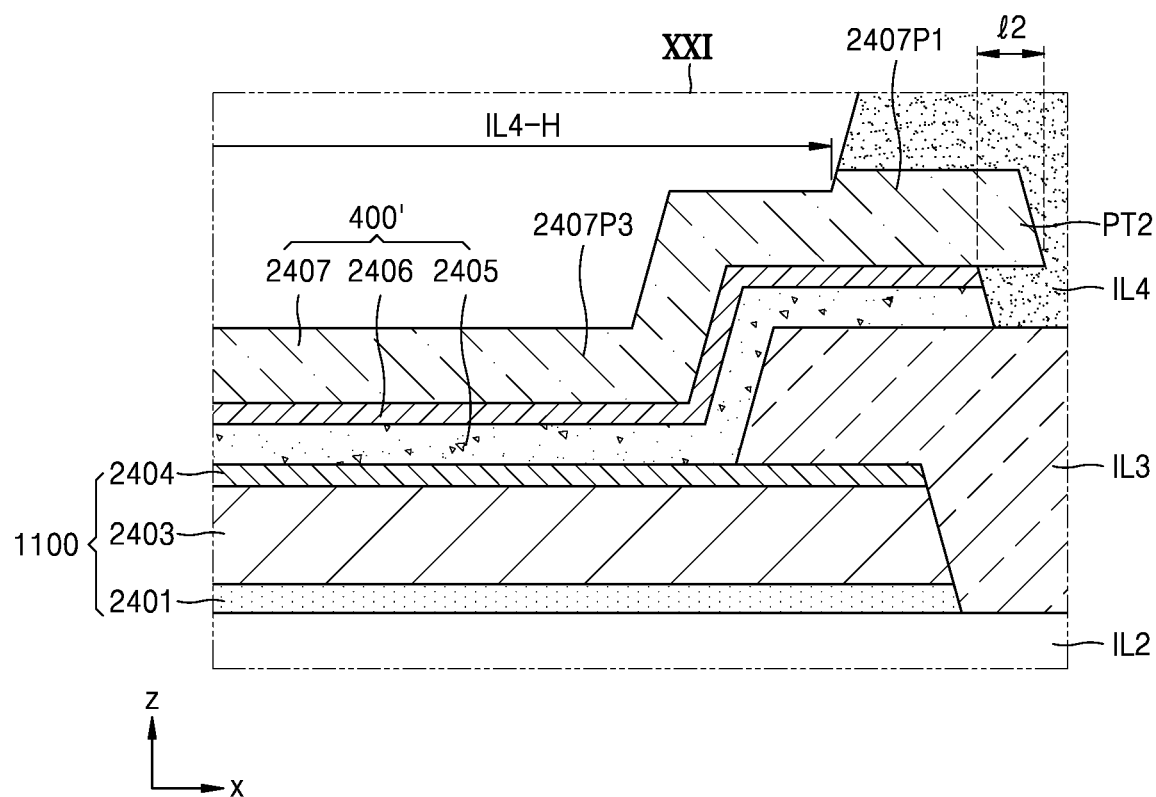

FIGS. 23A and 23B are schematic cross-sectional views of a pad electrode according to an embodiment and enlarged views of region XXI of FIG. 21.

At least one of the layers of the pad electrode 400' may include a tip protruding further in the lateral direction than other neighboring layers. As an example, as shown in FIG. 23A, the second conductive layer 2405 and/or the second oxide metal layer 2406 may protrude further in the lateral direction (the x-direction) than the first conductive layer 2407 to form a first tip PT1. In another embodiment, as shown in FIG. 23B, the first conductive layer 2407 may protrude further in the lateral direction (the x-direction) than the second conductive layer 2405 and/or the second oxide metal layer 2406 to form a second tip PT2. The lengths l1 and l2 of the first tip PT1 and the second tip PT2 may be about 0.2 μm or less.

Figure 24:
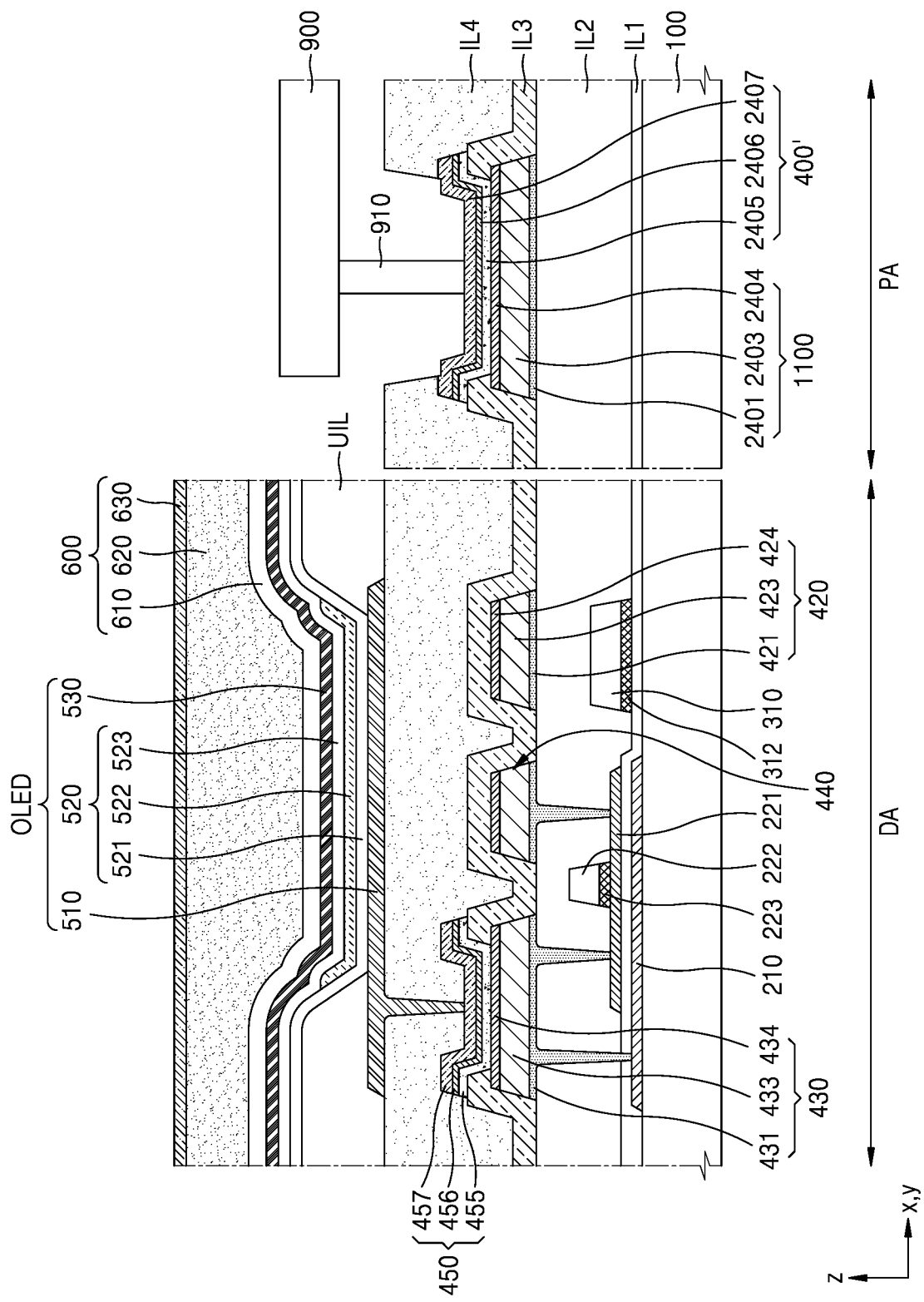
FIG. 24 is a schematic cross-sectional view of a display panel according to an embodiment.

FIG. 24 is a schematic cross-sectional view of a display panel according to an embodiment.

Referring to the peripheral area PA of FIG. 24, the pad electrode 400' and the wiring 1100 thereunder may be arranged. A specific structure thereof may be the same as that of the embodiment described with reference to FIGS. 18 to 23B.

An electronic circuit portion 900 may be electrically connected to the pad electrode 400' through a conductive material layer 910. The electronic circuit portion 900 may have a form of an IC chip as shown above in FIG. 15 or have a form of an FPCB as shown above in FIG. 16.

Referring to the display area DA of FIG. 24, a transistor and a storage capacitor may be arranged in the display area DA. The transistor may include the semiconductor layer 221, the gate electrode 222, the source electrode 430, and the drain electrode 440, the gate electrode 222 overlapping a channel region of the semiconductor layer 221, and the source electrode 430 and the drain electrode 440 respectively being connected to a source region and a drain region of the semiconductor layer 221. The storage capacitor may include the first electrode 310 and the second electrode 420.

The semiconductor layer 221 and the gate electrode 222 of the transistor, and the first electrode 310 of the storage capacitor may be the same as those described above with reference to FIG. 11.

The source electrode 430 and the drain electrode 440 of the transistor, and the second electrode 420 of the storage capacitor may be simultaneously formed during a process of forming the wiring 1100. Accordingly, the source electrode 430 and the drain electrode 440 of the transistor, and the second electrode 420 of the storage capacitor may have the same structure as that of the wiring 1100. With regard to this, it is shown in FIG. 24 that the sub-layers 421, 423, and 424 of the second electrode 420, the sub-layers 431, 433, and 434 of the source electrode 430, and sub-layers of the drain electrode 440 may respectively include the same materials as those of the auxiliary layer 2401, the main metal layer 2403, and the first oxide metal layer 2404.

One of the source electrode 430 and the drain electrode 440 may be electrically connected to the pixel electrode 510 through an intermediate conductive layer 450. In an embodiment, it is shown in FIG. 24 that the drain electrode 440 may be connected to the intermediate conductive layer 450.

The intermediate conductive layer 450 may have the same structure as that of the pad electrode 400'. The intermediate conductive layer 450 may include sub-layers 455, 456, and 457. The sub-layers 455, 456, and 457 may respectively include the same materials as those of the second conductive layer 2405, the second oxide metal layer 2406, and the first conducive layer 2407.

The edges of the pixel electrode 510 may be covered by an upper insulating layer UIL. The intermediate layer 520 and the opposite electrode 530 may be arranged on the pixel electrode 510. The organic light-emitting diode OLED including the pixel electrode 510, the intermediate layer 520, and the opposite electrode 530 may be covered by the encapsulation layer 600. A specific structure thereof may be the same as that described above with reference to FIG. 11.

Figure 25:
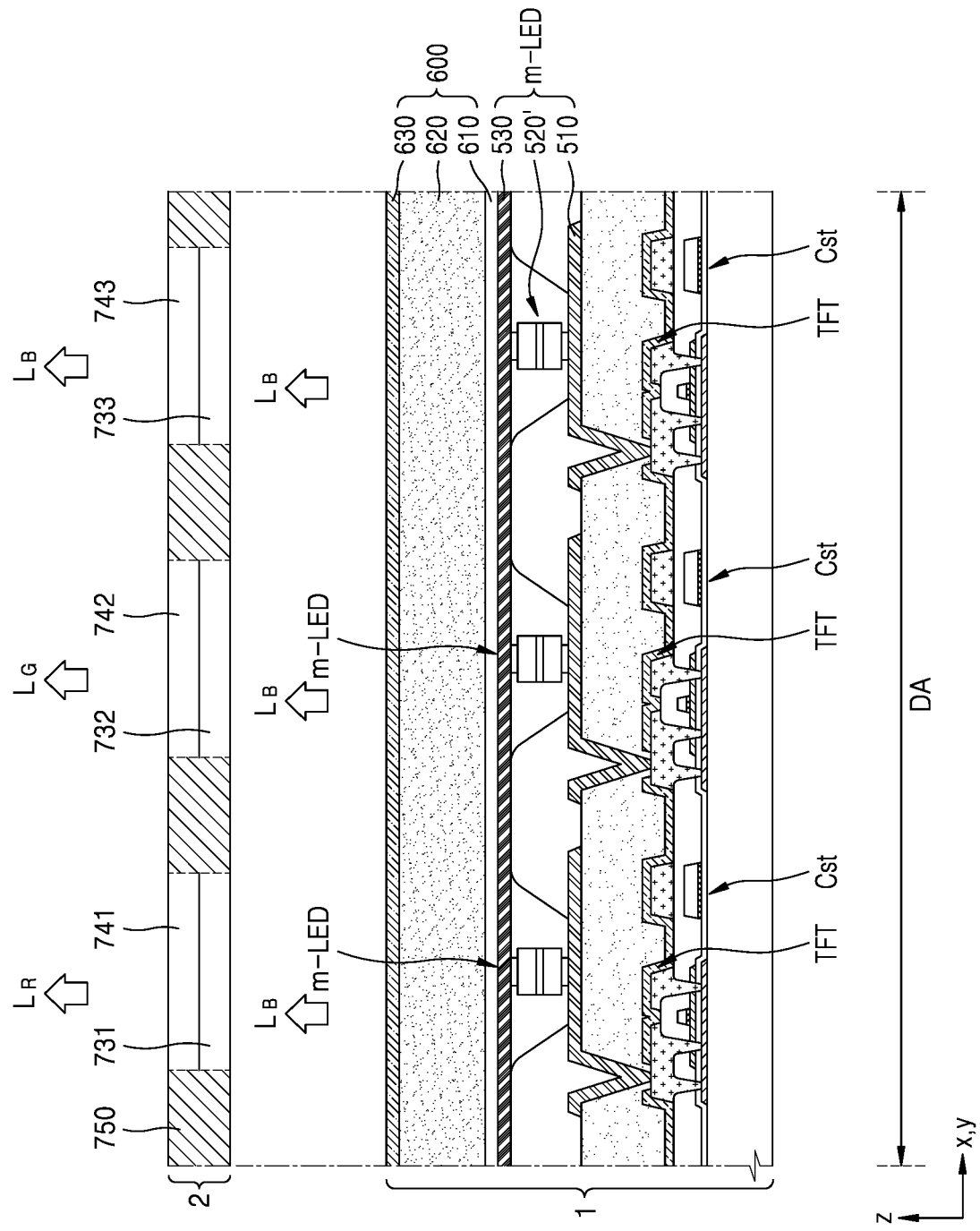
FIG. 25 is a schematic cross-sectional view of a display device according to an embodiment.
Figure 26A:
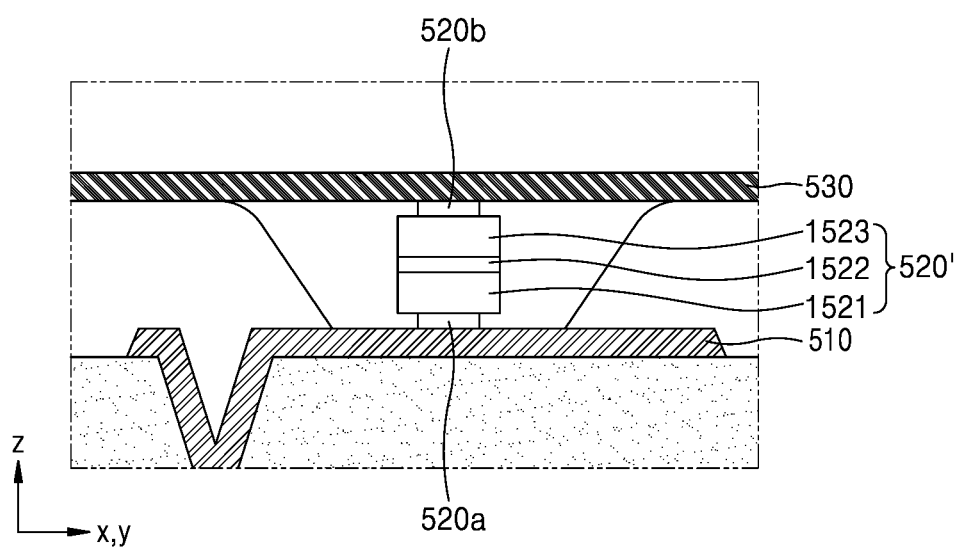
FIG. 26A is a schematic cross-sectional view of an inorganic light-emitting diode of FIG. 25.
Figure 26B:
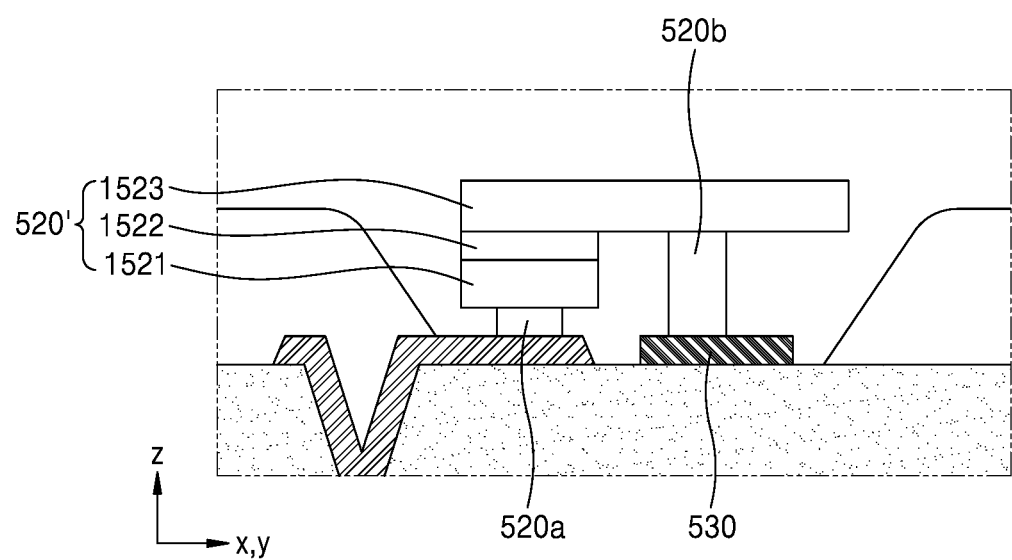
FIG. 26B is a schematic cross-sectional view of an inorganic light-emitting diode according to another embodiment.

FIG. 25 is a schematic cross-sectional view of a display device according to an embodiment, FIG. 26A is a schematic cross-sectional view of an inorganic light-emitting diode of FIG. 25, and FIG. 26B is a schematic cross-sectional view of an inorganic light-emitting diode according to another embodiment.

Referring to FIG. 25, the display device may include an inorganic light-emitting diode (or a micro light-emitting diode m-LED) as a light-emitting diode. Each inorganic light-emitting diode m-LED may emit light (e.g., blue light), and the emitted light may pass through the filter panel 2. As described above, the display device may display an image by using light that passes through the filter layer 2, for example, red light $L_R$, green light $L_G$, and blue light $L_B$.

Each pixel electrode 510 may be electrically connected to the pixel circuit including the thin-film transistor TFT (or a transistor) and the storage capacitor Cst. With regard to this, it is shown in FIG. 25 that the pixel electrode 510 may be connected to the thin-film transistor TFT. An intermediate layer 520' may be arranged on each pixel electrode 510 (or the first electrode), the intermediate layer 520' including the emission layer. The opposite electrode 530 (or the second electrode) may be arranged on the intermediate layer 520'.

Referring to FIG. 26A, the intermediate layer 520' may include a first semiconductor layer 1521, a second semiconductor layer 1523, and an emission layer 1522, the emission layer 1522 being between the first semiconductor layer 1521 and the second semiconductor layer 1523.

The first semiconductor layer 1521 may be implemented, for example, as a p-type semiconductor layer. A p-type semiconductor layer may include a semiconductor material having a composition formula of InxAlyGa1-x-yN ($0 \leq x \leq 1$, $0 \leq y \leq 1$, $0 \leq x+y \leq 1$), for example, at least one of GaN, AlN, AlGaN, InGaN, InN, InAlGaN, and AlInN, and be doped with p-type dopant such as Mg, Zn, Ca, Sr, and/or Ba. The first semiconductor layer 1521 may be connected to the pixel electrode 510 through a first conductive pad electrode 520a.

The second semiconductor layer 1523 may include, for example, an n-type semiconductor layer. An n-type semiconductor layer may include a semiconductor material having a composition formula of InxAlyGa1-x-yN ($0 \leq x \leq 1$, $0 \leq y \leq 1$, $0 \leq x+y \leq 1$), for example, at least one of GaN, AlN, AlGaN, InGaN, InN, InAlGaN, AlInN, and be doped with n-type dopant such as Si, Ge, and/or Sn. The second semiconductor layer 1523 may be connected to the opposite electrode 530 through a second conductive pad electrode 520b. The embodiment is not limited thereto. In another embodiment, the first semiconductor layer 1521 may include an n-type semiconductor layer, and the second semiconductor layer 1523 may include a p-type semiconductor layer.

The emission layer 1522 may be a region where electrons and holes recombine. In case that electrons and holes recombine, they may transition to a lower energy level, emitting light (e.g., blue light) having a wavelength corresponding thereto. The emission layer 1522 may include a semiconductor material having a composition formula of InxAlyGa1-x-yN ($0 \leq x \leq 1$, $0 \leq y \leq 1$, $0 \leq x+y \leq 1$) and have a single quantum-well structure or a multi-quantum-well (MQW) structure. The emission layer 1522 may have a quantum wire structure or a quantum dot structure.

Though it is shown in FIG. 26A that the first conductive pad electrode 520a and the second conductive pad electrode 520b may be positioned opposite each other around the intermediate layer 520', the embodiment is not limited thereto.

Referring to FIG. 26B, the first conductive pad electrode 520a and the second conductive pad electrode 520b may be arranged on a side of the intermediate layer 520', for example, below the intermediate layer 520'. The pixel electrode 510 and the opposite electrode 530 may be arranged on the same layer, the opposite electrode 530 having a polarity different from that of the pixel electrode 510.

Even in a horizontal type or flip type light-emitting diode shown in FIG. 26B, the intermediate layer 520' may include the first semiconductor layer 1521, the second semiconductor layer 1523, and the emission layer 1522. Specific characteristics thereof may be the same as those described above.

Figure 27:
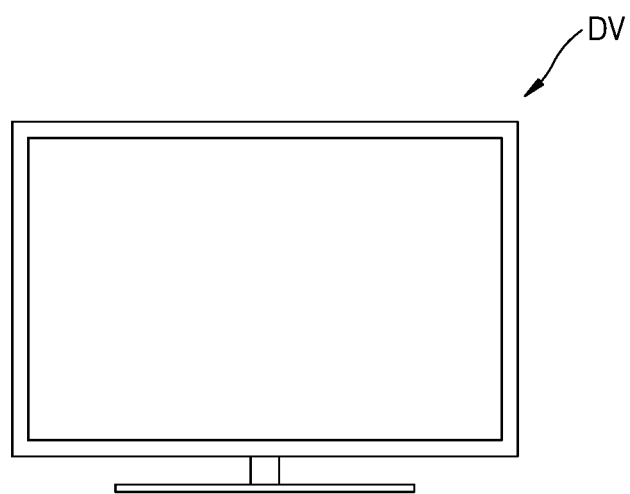
FIG. 27 is a schematic perspective view of a display device according to an embodiment.

FIG. 27 is a schematic perspective view of a display device DV according to an embodiment.

The display device DV may be a television as shown in FIG. 27. In another embodiment, the display device DV may include various electronic products such as outdoor advertisement boards, and movie display devices. For example, just as the display device DV may be applicable to a display portion of artificial intelligence speakers, the display device according to an embodiment may be applicable to any kind of electronic apparatus as far as the electronic apparatus may provide a preset image.

Embodiments may provide a display device including high-quality pad electrodes. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display device comprising:
   a display area;
   a peripheral area disposed adjacent to the display area;
   light-emitting diodes disposed in the display area;
   transistors electrically connected to the light-emitting diodes; and
   a pad section including a pad electrode having a multi-layered structure, the pad electrode being disposed in the peripheral area,
   wherein the pad electrode includes:
      a main metal layer comprising a first metal element;
      a first conductive layer on an upper surface of the main metal layer, the first conductive layer including zinc indium tin oxide (ZITO);
      a first oxide metal layer between the main metal layer and the first conductive layer, wherein the first oxide metal layer comprises a first metal oxide including the first metal element and an oxygen atom, wherein a thickness of the first oxide metal layer is less than a thickness of the main metal layer; and
      an auxiliary layer on a lower surface of the main metal layer.

2. The display device of claim 1, wherein the zinc indium tin oxide (ZITO) is amorphous, and
   a tin content of the zinc indium tin oxide is about 5 at % to about 25 at % with respect to a content of zinc and indium.

3. The display device of claim 1, wherein the first conductive layer further includes at least one of indium tin oxide (ITO), indium zinc oxide (IZO), zinc oxide (ZnO), indium oxide ($In_2O_3$), indium gallium oxide (IGO), and aluminum zinc oxide (AZO).

4. The display device of claim 1, further comprising:
   a second conductive layer disposed between the main metal layer and the first conductive layer, wherein
   the second conductive layer includes a second metal element, and
   the second metal element is different from the first metal element of the main metal layer.

5. The display device of claim 4, further comprising:
   a second oxide metal layer between the second conductive layer and the first conductive layer, wherein
   the second oxide metal layer includes a second metal oxide, and
   the second oxide metal layer includes the second metal element of the second conductive layer and an oxygen atom.

6. The display device of claim 1, wherein the auxiliary layer includes a metal layer or a transparent conductive oxide layer.

7. The display device of claim 1, further comprising:
   a wiring in the peripheral area;
   a first insulating layer disposed between the wiring and the pad electrode, the first insulating layer including a contact hole for electrical connection between the wiring and the pad electrode; and
   a second insulating layer overlapping a connection region of the wiring and the pad electrode, the second insulating layer including a hole overlapping the pad electrode.

8. The display device of claim 7, wherein
   the pad electrode includes:
      an outer portion overlapping the second insulating layer; and
      an inner portion overlapping the hole of the second insulating layer, and a thickness of the outer portion is greater than a thickness of the inner portion.

9. The display device of claim 7, wherein the second insulating layer includes an inorganic insulating material.

10. The display device of claim 1, wherein
    each of the transistors include:
       a semiconductor layer including a channel region, a source region, and a drain region, the source region and the drain region being respectively disposed on two opposite sides of the channel region;
       a lower electrode disposed below the semiconductor layer;
       a gate electrode disposed over the semiconductor layer, the gate electrode overlapping the channel region; and
       an electrode electrically connected to the source region or the drain region, and
    the pad electrode is disposed in a same layer as the lower electrode, the gate electrode, or the electrode.

11. The display device of claim 1, further comprising:
    an organic insulating layer on the pad electrode and having a hole overlapping the pad electrode,
    wherein a thickness of a first portion of the first conductive layer that is overlapped by the organic insulating layer is greater than a thickness of a second portion of the first conductive layer that is overlapped by the hole of the organic insulating layer.

12. The display device of claim 1, wherein the first metal element comprises copper (Cu), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), or molybdenum (Mo).

13. The display device of claim 4, wherein the second conductive layer includes at least one of titanium, molybdenum, and tungsten.

14. The display device of claim 1, wherein the auxiliary layer includes a metal layer.

15. The display device of claim 1, wherein the first oxide metal layer is in direct contact with the upper surface of the main metal layer.

* * * * *